United States Patent
Doornbos

(10) Patent No.: US 11,637,067 B2
(45) Date of Patent: *Apr. 25, 2023

(54) SEMICONDUCTOR DEVICE INCLUDING BACK SIDE POWER SUPPLY CIRCUIT

(71) Applicant: TAIWAN SEMICONDUCTOR MANUFACTURING CO., LTD., Hsinchu (TW)

(72) Inventor: Gerben Doornbos, Kessel-Lo (BE)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 73 days.

This patent is subject to a terminal disclaimer.

(21) Appl. No.: 17/202,255

(22) Filed: Mar. 15, 2021

(65) Prior Publication Data

US 2021/0272903 A1  Sep. 2, 2021

Related U.S. Application Data

(63) Continuation of application No. 16/573,459, filed on Sep. 17, 2019, now Pat. No. 10,950,546.

(51) Int. Cl.
*H01L 23/528* (2006.01)
*H01L 27/118* (2006.01)
(Continued)

(52) U.S. Cl.
CPC .... *H01L 23/5286* (2013.01); *H01L 21/76898* (2013.01); *H01L 21/823821* (2013.01);
(Continued)

(58) Field of Classification Search
CPC .............. H01L 23/5286; H01L 23/535; H01L 23/481; H01L 21/823871; H01L 21/76898;
(Continued)

(56) References Cited

U.S. PATENT DOCUMENTS 10,068,874 B2  9/2018  Nelson et al.
10,380,315 B2  8/2019  Zhuang et al.
(Continued)

FOREIGN PATENT DOCUMENTS

CN  108807367 A  11/2018
CN  109599400 A  4/2019
(Continued)

OTHER PUBLICATIONS

Khaja Ahmad SHAIK, "Buried Power Rail and PDN in SOC Context for IN5:SRAM and Logic," Logic Insite Y106, IMEC Partner Technical Week, 37 pgs, Oct. 2018.
Stephen Kosonocky, "Practical Power Gating and Dynamic Voltage/Frequency Scaling," AMD, pp. 1-62, Aug. 17, 2011.
Notice of Allowance issued in U.S. Appl. No. 16/573,459, dated Oct. 28, 2020.
(Continued)

*Primary Examiner* — Joseph C. Nicely
(74) *Attorney, Agent, or Firm* — McDermott Will & Emery LLP

(57) ABSTRACT

A semiconductor device includes a substrate, a front side circuit disposed over a front surface of the substrate, and a backside power delivery circuit disposed over a back surface and including a back side power supply wiring coupled to a first potential. The front side circuit includes semiconductor fins and a first front side insulating layer covering bottom portions of the semiconductor fins, a plurality of buried power supply wirings embedded in the first front side insulating layer, the plurality of buried power supply wirings including a first buried power supply wiring and a second buried power supply wiring, and a power switch configured to electrically connect and disconnect the first buried power supply wiring and the second buried power supply wiring. The second buried power supply wiring is connected to the
(Continued)

back side power supply wiring by a first through-silicon via passing through the substrate.

20 Claims, 25 Drawing Sheets

(51) Int. Cl.
*H01L 27/092* (2006.01)
*H01L 23/48* (2006.01)
*H01L 21/768* (2006.01)
*H01L 21/8238* (2006.01)
*H01L 21/84* (2006.01)
*H01L 23/522* (2006.01)
*H01L 23/535* (2006.01)
*H01L 27/12* (2006.01)
*H01L 21/762* (2006.01)

(52) U.S. Cl.
CPC .... *H01L 21/823871* (2013.01); *H01L 21/845* (2013.01); *H01L 23/481* (2013.01); *H01L 23/5226* (2013.01); *H01L 23/535* (2013.01); *H01L 27/0924* (2013.01); *H01L 27/11807* (2013.01); *H01L 27/1211* (2013.01); *H01L 21/76224* (2013.01); *H01L 2027/11881* (2013.01)

(58) Field of Classification Search
CPC .......... H01L 21/823821; H01L 21/845; H01L 27/1211; H01L 27/11807; H01L 27/0924
See application file for complete search history.

(56) References Cited

U.S. PATENT DOCUMENTS

| | | | |
|---|---|---|---|
| 10,700,039 | B2 | 6/2020 | Nelson et al. |
| 10,950,546 | B1 * | 3/2021 | Doornbos ......... H01L 27/11807 |
| 2009/0300569 | A1 | 12/2009 | Frenkil et al. |
| 2010/0237436 | A1 | 9/2010 | Inaba |
| 2015/0294975 | A1 | 10/2015 | Nakata |
| 2018/0145030 | A1 * | 5/2018 | Beyne ................. H01L 23/5283 |
| 2019/0267316 | A1 | 8/2019 | Nelson et al. |

FOREIGN PATENT DOCUMENTS

| | | |
|---|---|---|
| KR | 10-2017-0018813 A | 2/2017 |
| KR | 10-2017-0021229 A | 2/2017 |
| KR | 10-2018-0030450 A | 3/2018 |
| TW | 201330199 A | 7/2013 |

OTHER PUBLICATIONS

Notice of Allowance issued in corresponding Korean Patent Application No. 10-2020-0001524, dated Apr. 6, 2021.

* cited by examiner

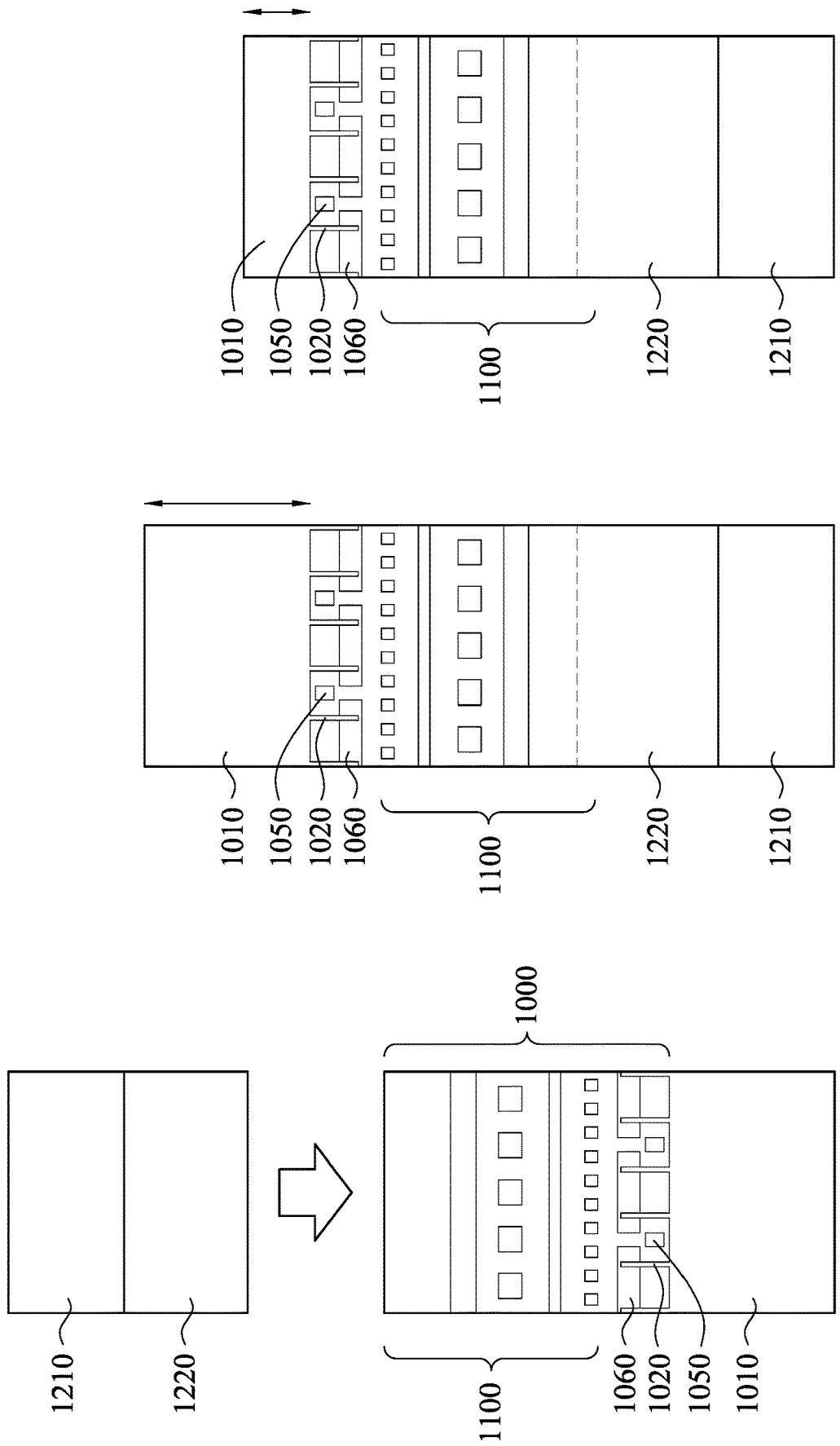

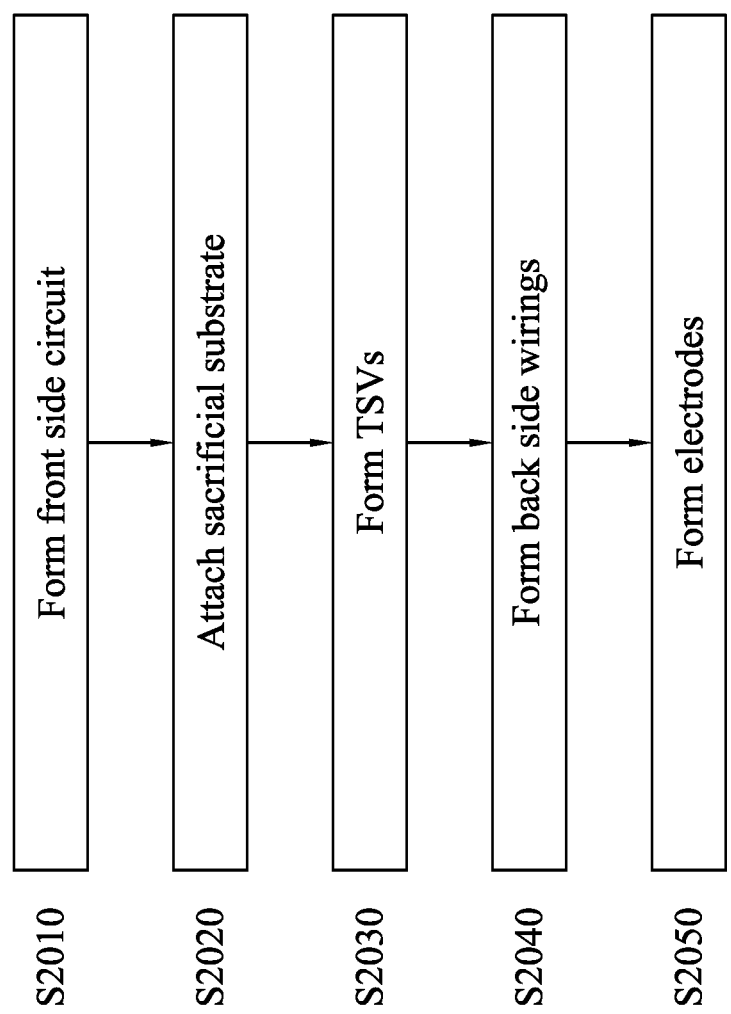

SEMICONDUCTOR DEVICE INCLUDING BACK SIDE POWER SUPPLY CIRCUIT

RELATED APPLICATION

This application is a continuation of application Ser. No. 16/573,459 filed on Sep. 17, 2019, now U.S. Pat. No. 10,950,546, the entire content of which is incorporated

BACKGROUND

As the size of semiconductor devices becomes smaller, a cell height of standard cells also becomes smaller. The cell height is generally defined as a periodic distance (pitch) between two power supply lines, VDD and VSS, and is generally determined by the number and a pitch of fin structures and/or metal lines. The cell height is also called a track height. Typical track heights are 7.5T, 6.5T or 5.5T, where T is a smallest pitch of metal lines running over the standard cell. Scaling down to 4.5T or 4T is currently required to further minimize the size of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A, 18B and 18C show cross sectional views illustrating manufacturing operations of a semiconductor device with a backside power switch circuit according to an embodiment of the present disclosure.

FIG. 20 shows a flow of a manufacturing operation of a semiconductor device with a backside power supply circuit according to an embodiment of the present disclosure.

DETAILED DESCRIPTION

Figure 1:
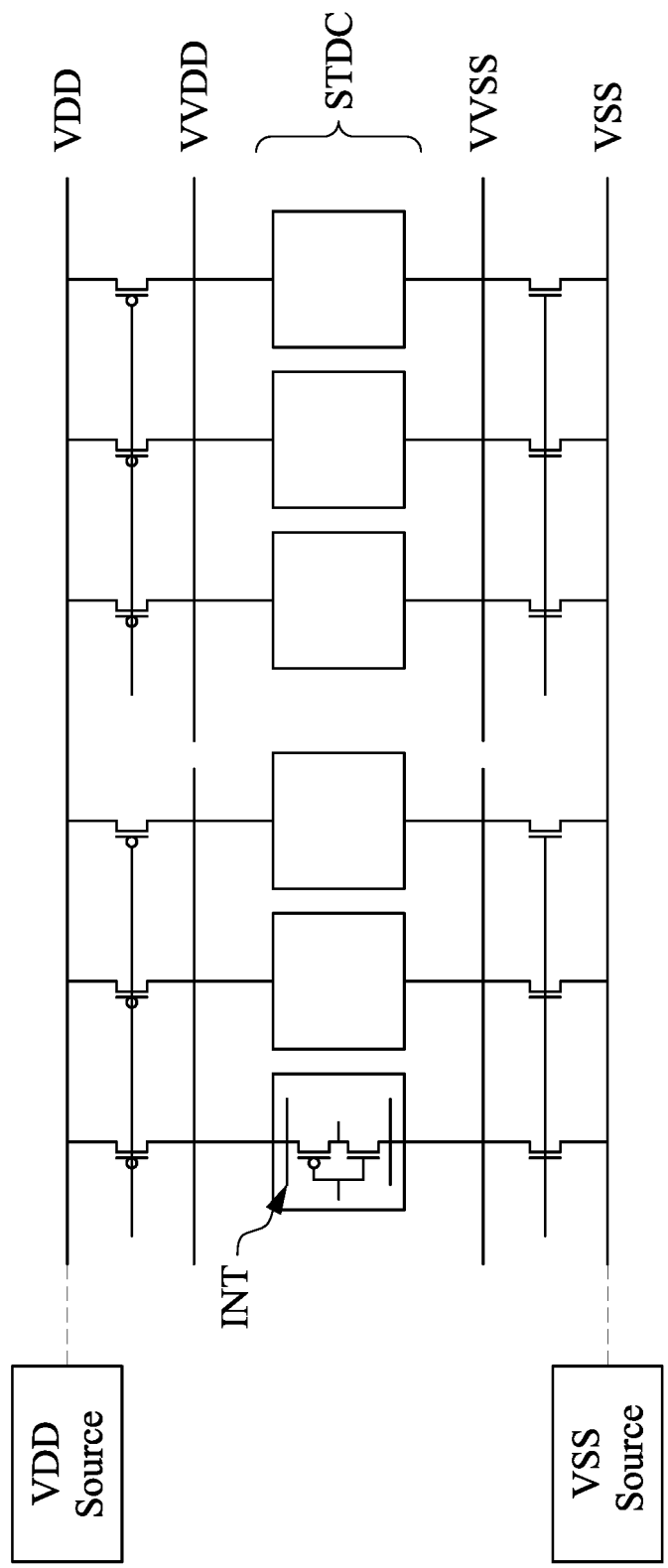
FIG. 1 shows a circuit diagram of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

Minimization of power consumption in a semiconductor device, such as an integrated circuit (IC), is a critical issue for semiconductor devices for high speed operations of and/or semiconductor devices for mobile terminals. Various technologies to reduce the power consumption have been proposed, but many of them require a larger chip area due to additional circuitry for controlling power. One such technology includes providing a virtual power supply line (VVDD and/or VVSS) together with a header switch and/or a footer switch between a main power supply line (VDD and/or VSS) and the virtual power supply line. The virtual power supply line may be called a local power supply line, while the main power supply line may be called a global power supply line. It is noted that VDD is generally at a higher potential (voltage) than VSS, and in some embodiments, VSS is coupled to the ground (0 V). The power consumption is reduced by turning-off (opening) the header/footer switch coupled to a non-active functional circuit in the semiconductor device.

FIG. 1 shows a circuit diagram of a semiconductor device according to an embodiment of the present disclosure. As shown in FIG. 1, a p-type MOS FET is used as a header switch and an n-type MOS FET is used as a footer switch to shut off the power supply to the local VVDD which further supplies power to blocks comprising one or more standard cells STDC, each including a functional circuit (e.g., a CMOS inverter). In some embodiments, no footer switch is used and the standard cells are directly coupled to the VSS. In some embodiments, as shown in FIG. 1, a first main power supply line VDD is coupled to a VDD generation circuit (Vdd Source) which generates a voltage, such as 0.5 V, 0.8 V, 1.0 V, 1.2 V, 1.8 V, 2.4 V, 3.3 V or 5.0 V. A second main power supply line VSS is coupled to a VSS generation circuit (Vss Source) which generates a voltage lower than VDD, or the ground, in some embodiments. As shown in FIG. 1, the local power supply lines VVDD is divided into a plurality of local power supply lines, to each of which one or more standard cells STDC are connected, as a cell block. Accordingly, power supply to the standard cells can be controlled on a block-by-block basis. Further, in some embodiments, the standard cells STDC includes an internal power supply line (bus line) INT, and the local power supply line VVDD is coupled to the internal power supply line with or without a switch.

In this disclosure, a semiconductor device includes a semiconductor substrate, a front side circuit disposed over a front surface of the substrate, and a back side power delivery circuit disposed over a back surface of the substrate. The back side power delivery circuit includes a first back side power supply wiring coupled to a first potential (e.g., Vdd or Vss). The front side circuit includes standard cells as a logic circuit and a power switch circuit. The front side circuit includes a plurality of semiconductor fins constituting fin field effect transistors (FinFETs) and a front side insulating layer (e.g., shallow trench isolation (STI)) covering bottom portions of the plurality of semiconductor fins. The front side circuit further includes a plurality of buried power supply wirings (e.g., buried power lines or buried power rails) embedded in the front side insulating layer. The plurality of buried power supply wirings include a first buried power supply wiring (e.g., VVDD) and a second buried power supply wiring (e.g., VDD). The front side circuit also includes a power switch circuit configured to electrically connect and disconnect the first buried power supply wiring and the second buried power supply wiring. The second buried power supply wiring (VDD) is connected to the first back side power supply wiring by a through-silicon via (TSV) passing through the substrate.

Figure 2A:
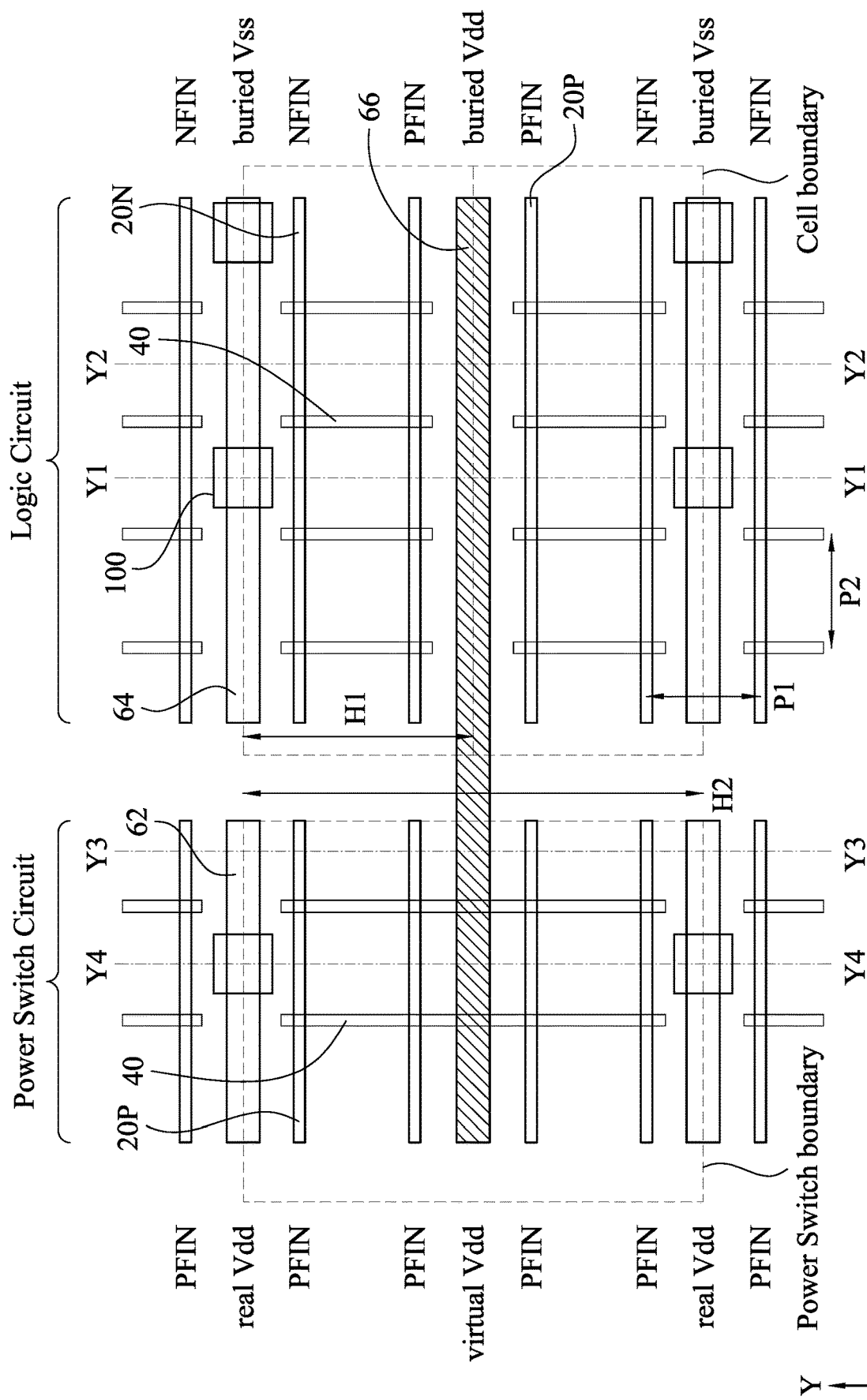
FIGS. 2A, 2B and 2C show layouts of a power switch circuit and a logic circuit according to an embodiment of the present disclosure.
Figure 2B:
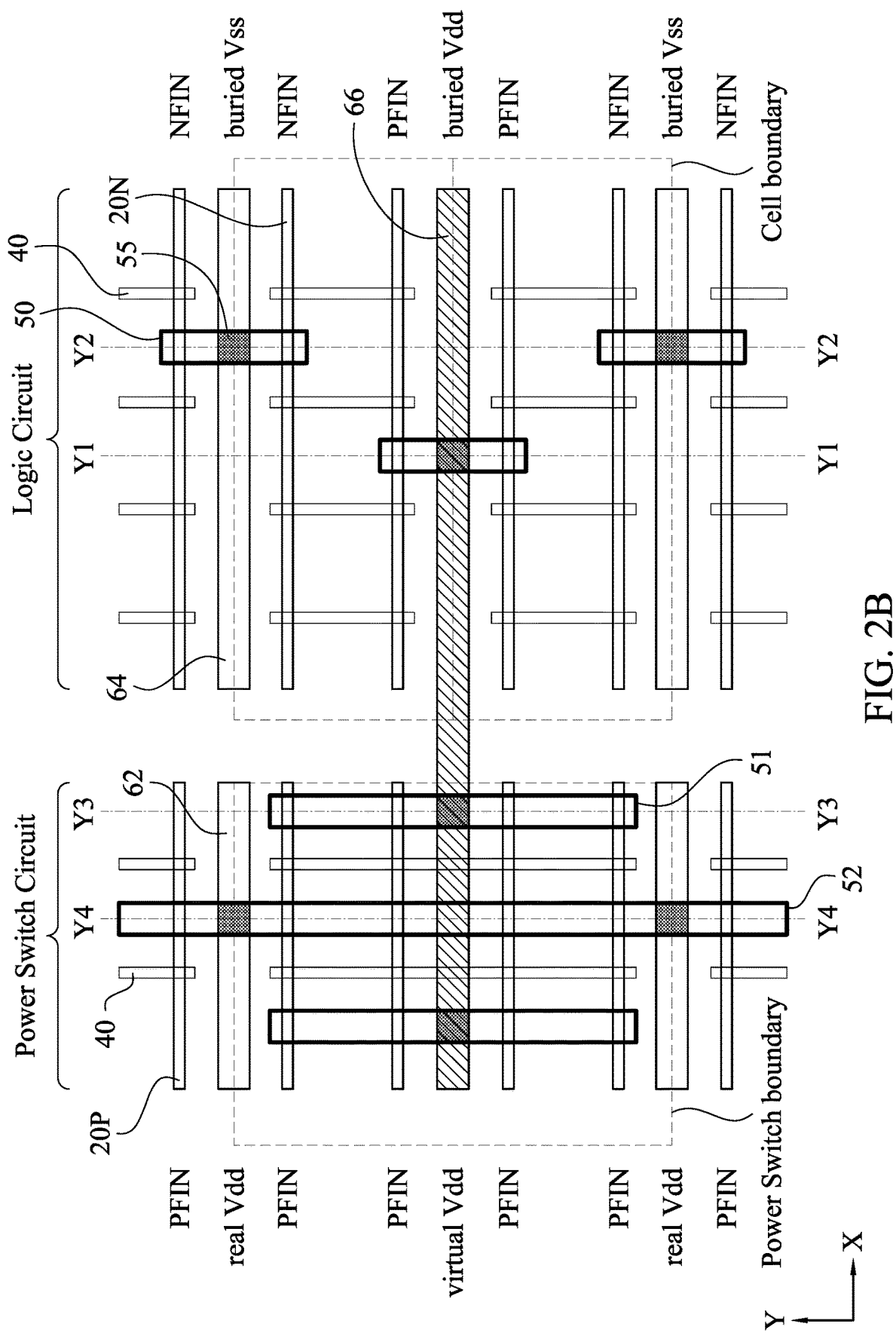
Figure 2C:
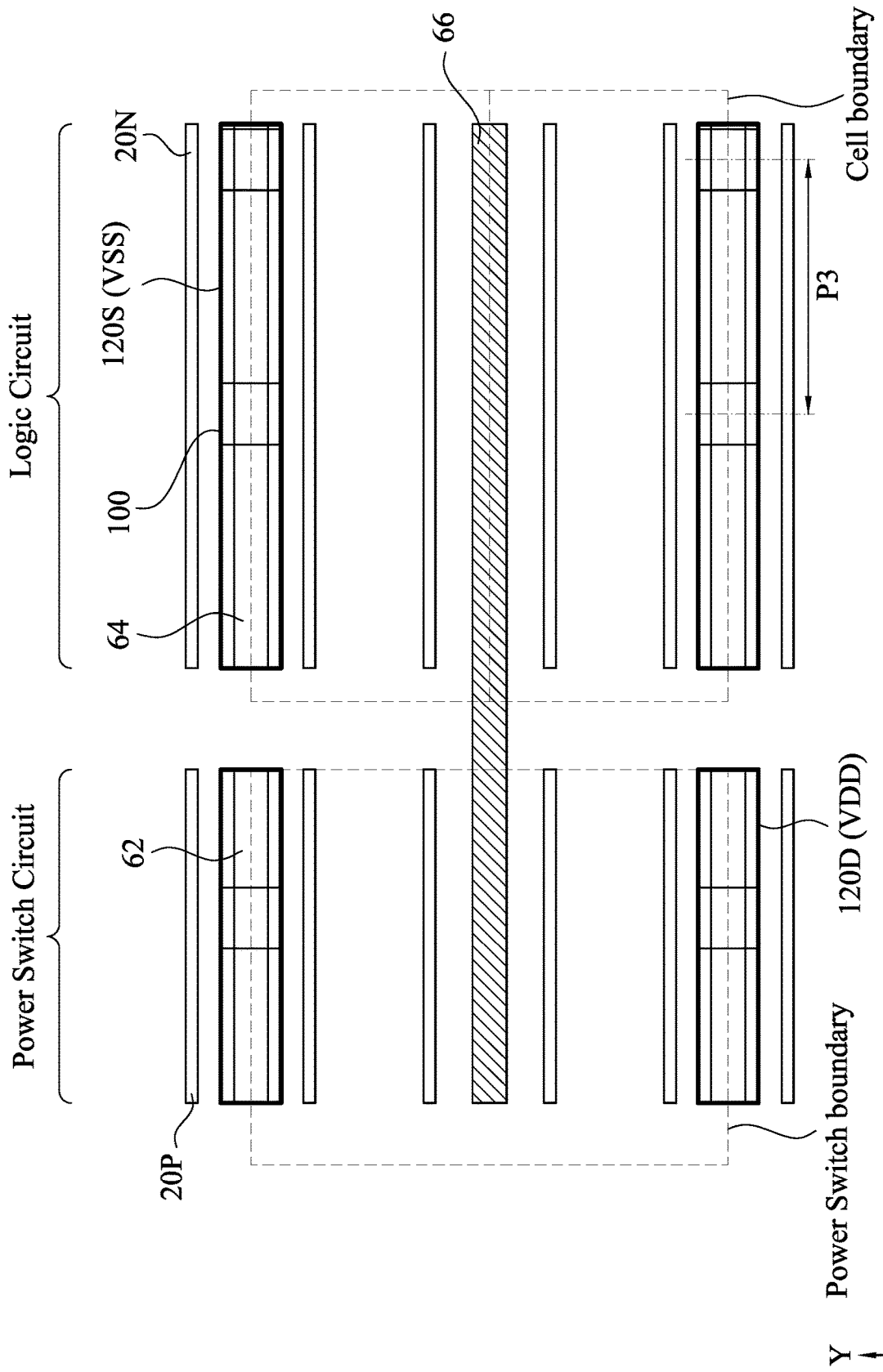

FIGS. 2A-2C show layouts of a semiconductor device having a power supply circuit. As shown in FIGS. 2A-2C, the semiconductor device includes a power switch circuit (area) and a logic circuit (area). The logic circuit includes a plurality of standard cells having a cell height H1 and arranged in the row direction (e.g., X) in some embodiments. A cell height of the standard cell is defined as a pitch of two power supply lines for the different potentials (e.g., Vdd and Vss) in some embodiments. In some embodiments, the cell height H1 is in a range from about 120 nm to about 240 nm depending on the design rule of the front side circuit. In FIG. 2B, through-silicon vias 100 are omitted, and in FIG. 2C, gate electrodes 40 and source/drain contact layers 50, 51, 52 are omitted.

Each row of the standard cells includes a plurality of semiconductor fins extending in the X direction. In some embodiments, two fin structures 20N or NFIN (n-type fin) for an n-type FinFET and 20P or PFIN (p-type fin) for a p-type FinFET are disposed. In some embodiments, the fins 20N, 20P are arranged with a constant pitch P1. The pitch P1 is in a range from about 30 nm to about 80 nm in some embodiments depending on the design rule. In some embodiments, the fins are divided into multiple pieces along the X direction to provide isolation between respective electric functions (circuits).

As shown in FIG. 2A, a plurality of gate electrodes 40 extending in the Y direction (column direction) are disposed over the fins. In some embodiments, each of the gate electrodes 40 is disposed over one n-type fin and one p-type fin constituting a CMOS structure. The pitch P2 of the gate electrodes 40 is in a range from about 30 nm to about 50 nm in some embodiments depending on the design rule.

The logic circuit further includes buried power supply lines (wirings) for supplying power Vdd and Vss to the standard cells. The detailed structures of the buried power supply wirings are explained later. In some embodiments, as shown in FIG. 2A, the logic circuit includes one first buried power supply wiring 66 for supplying a first potential Vdd and two third buried power supply wirings 64 for supplying a second potential Vss. The first buried power supply wiring 66 functions as a virtual or local power supply wiring VVDD. The third buried power supply wiring 64 functions as a power supply wiring VSS. As shown in FIG. 2B, the first buried power supply wiring 66 for the first potential Vdd is disposed between two adjacent p-type fins in plan view, and the third buried power supply wiring 64 for the second potential Vss is disposed between two adjacent n-type fins in plan view. No gate electrode overlaps the first buried power supply wiring 66 for the first potential Vdd.

As shown in FIG. 2B, the buried power supply wirings are coupled to source regions of the fins (FinFETs) by source/drain contact layer 50. In some embodiments, a plug 55 is disposed between the source/drain contact layer 50 and the buried power supply wirings. In certain embodiments, the plug 55 is a part of the source/drain contact layer 50, and thus is integrally formed. As shown in FIG. 2B, the first buried power supply wiring 66 for supplying the first potential Vdd is connected to the p-type fins, and the third buried power supply wiring 64 for supplying the second potential Vss is connected to the n-type fins.

The third buried power supply wirings 64 for supplying the second potential Vss (i.e., the front side power supply wiring) are connected to second back side power supply wirings 120S by one or more through-silicon vias (TSVs) 100, as shown in FIG. 2C. The second back side power supply wirings 120S overlap the third buried power supply wirings 64, respectively. Two or more TSVs 100 are arranged with a constant pitch P3 along the X direction as shown in FIG. 2C in some embodiments. As shown in FIG. 2C, no back side power supply wiring is arranged to overlap the local power supply wiring 66 in some embodiments. In some embodiments, the TSV 100 does not overlap the plug 55 of the source/drain contact layer 50 (i.e., offset). In other embodiments, the TSV 100 overlaps the plug 55 of the source/drain contact layer 50.

The power switch circuit also includes a plurality of semiconductor fins extending in the X direction. In some embodiments, only one type of fins is included in the power switch circuit. In some embodiments, four or more p-type fin structures 20P are disposed between two buried power supply wirings 62. In some embodiments, the fins 20P are arranged with a constant pitch, which is the same as the pitch P1. In some embodiments, the fins are continuous within one power switch circuit.

As shown in FIG. 2A, a plurality of gate electrodes 40 extending in the Y direction are disposed over the p-type fins. In some embodiments, each of the gate electrodes 40 is disposed over all the p-type fins, thereby constituting a PMOS structure. The pitch of the gate electrodes 40 is the same as the pitch P2 in some embodiments.

The power switch circuit further includes buried power supply lines (wirings) for supplying power Vdd to the standard cells. In some embodiments, as shown in FIG. 2A, the power switch circuit includes two second buried power supply wirings 62 (main or real VDD) for receiving and supplying the first potential Vdd and one first buried power supply wiring 66 for supplying the first potential Vdd to the logic circuit. The first buried power supply wiring 66 functions as a virtual or local power supply wiring VVDD and is continuously formed over the power switch circuit and the logic circuit as shown in FIG. 2A. The second buried power supply wirings 62 received the first potential from back side power supply wirings. As shown in FIG. 2B, the first buried power supply wiring 66 for the first potential Vdd is disposed between two adjacent p-type fins in plan view, and the second buried power supply wiring 62 is disposed between two adjacent p-type fins in plan view. The gate electrodes 40 overlap the first buried power supply wiring 66 for the first potential Vdd.

As shown in FIG. 2B, the buried power supply wirings are coupled to drain regions of the p-type fins (FinFETs) by source/drain contact layer 51. As shown in FIG. 2B, two or more source/drain contact layers 51 connect four fin structures 20P to the first buried power supply wiring 66 for the first potential Vdd in some embodiments. Further, at least one source/drain contact layer 52 connects the source of the four fin structures 20P to two second buried power supply wirings 62 for the first potential Vdd in some embodiments. In some embodiments, the at least one source/drain contact layer 52 is further connected to p-type fins in adjacent rows (other power switch circuits adjacent in the Y direction).

The second buried power supply wirings 62 for supplying the first potential Vdd (i.e., the front side power supply wiring) are connected to first back side power supply wirings 120D by one or more TSVs 100, as shown in FIG. 2C. The first back side power supply wirings 120D overlap the second buried power supply wirings 62, respectively. Two or more TSVs 100 are arranged with a constant pitch (e.g., P3) along the X direction in some embodiments. As shown in FIG. 2C, no back side power supply wiring is arranged to overlap the local power supply wiring 66 in some embodiments. In some embodiments, the TSV 100 does not overlap the plug 55 of the source/drain contact layer 52 (i.e., offset). In other embodiments, the TSV 100 overlaps the plug 55 of the source/drain contact layer 52.

With the foregoing configuration, the first potential Vdd supplied from the first back side power supply wiring 120D is supplied to the second buried power supply wiring 62 for the first potential, and the PMOS switch controls supply of the first potential from the second buried power supply wiring 62 to the first buried power supply wiring 66. As shown in FIG. 2A, the power switch circuit is defined by a power switch boundary, which is between two second buried power supply wirings 62. In some embodiments, the number of the gate electrodes 40 within one power supply circuit is in a range from about 20 to 40 depending on various circuit requirements. As shown in FIGS. 2A-2C, one power switch circuit can supply the first potential Vdd to two rows of standard cells in the logic circuit. In some embodiments, one row of the logic circuit controlled by one power switch circuit includes about 400 to about 600 gate electrodes. The ratio of the number of gate electrodes in the power switch circuit to the number of gate electrodes in the logic circuit is in a range from about 0.033 to 0.1. Thus, the power switch circuit occupies about 3.2% to about 9.1% of the total circuit area.

In some embodiments, the number of the rows of the standard cells controlled by one power switch circuit is 1 to 4 in some embodiments, and is an even number, such as 2 or 4 in certain embodiments.

As shown in FIGS. 2A-2C, the third buried power supply wiring 64 is separated from and aligned with the second buried power supply wiring 62 in the X direction in plan view. In other words, a buried power supply wiring is cut at the boundary of the power switch circuit and the logic circuit. In contrast, the first buried power supply wiring 66 continuously extends over the power switch circuit and the logic circuit controlled by the power switch circuit. Further, as shown in FIGS. 2A-2C, the fins in the power supply circuits are separated from and aligned with the fins in the logic circuit in the X direction, respectively, in plan view. In some embodiments, one of the p-type fins in the power supply circuits is separated from and aligned with one of the n-type fins in the logic circuit in the X direction in plan view. On the back side, the first back side power supply wiring 120D is separated from and aligned with the second back side power supply wiring 120S in the X direction in plan view. As shown in FIGS. 2A-2C, the layout of the power switch circuit is symmetric with respect to the first buried power supply wiring 66.

Figure 3A:
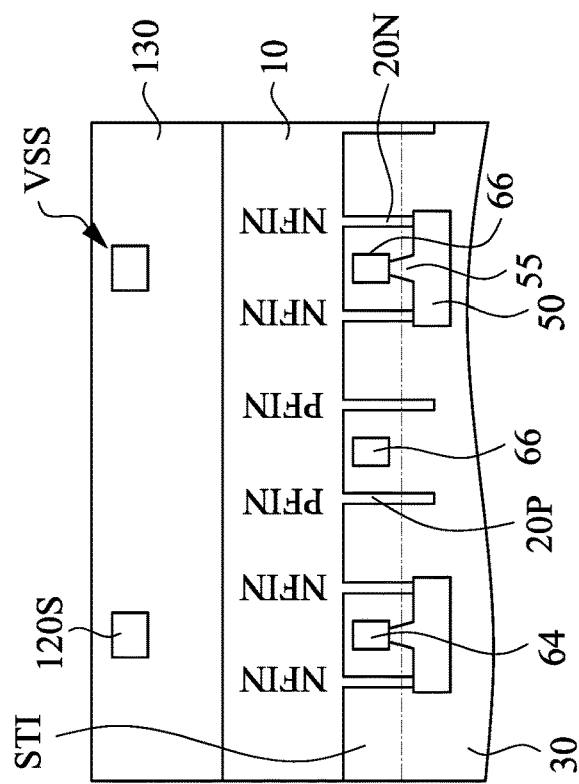
FIGS. 3A, 3B, 3C and 3D show cross sectional views of a power switch circuit and a logic circuit according to an embodiment of the present disclosure.
Figure 3B:
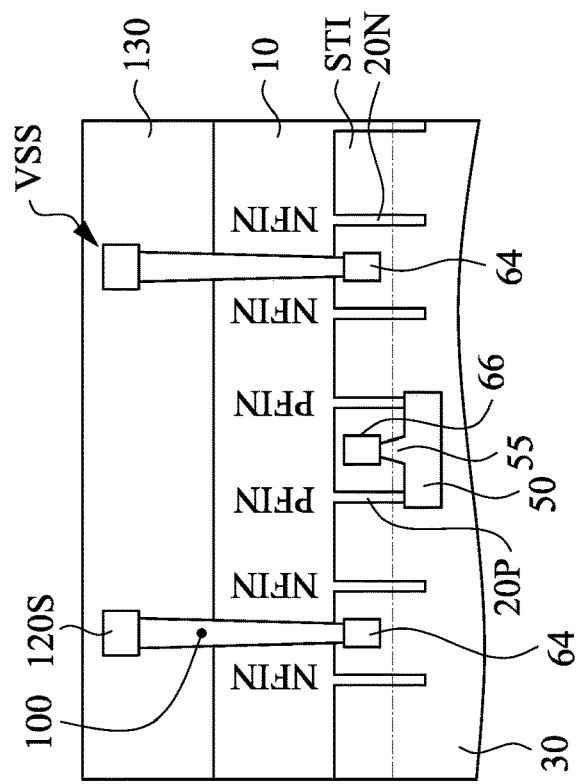

FIGS. 3A-3D show cross sectional views of the semiconductor device with a back side power supply circuit according to an embodiment of the present disclosure. FIG. 3A corresponds to the line Y1-Y1 of FIG. 2A and FIG. 3B corresponds to the line Y2-Y2 of FIG.

Figure 3D:
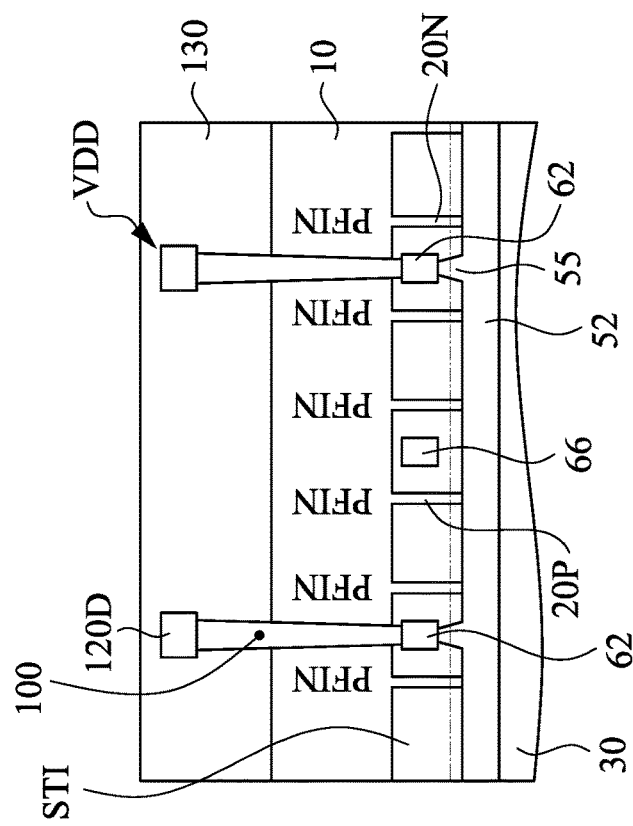
Figure 3C:
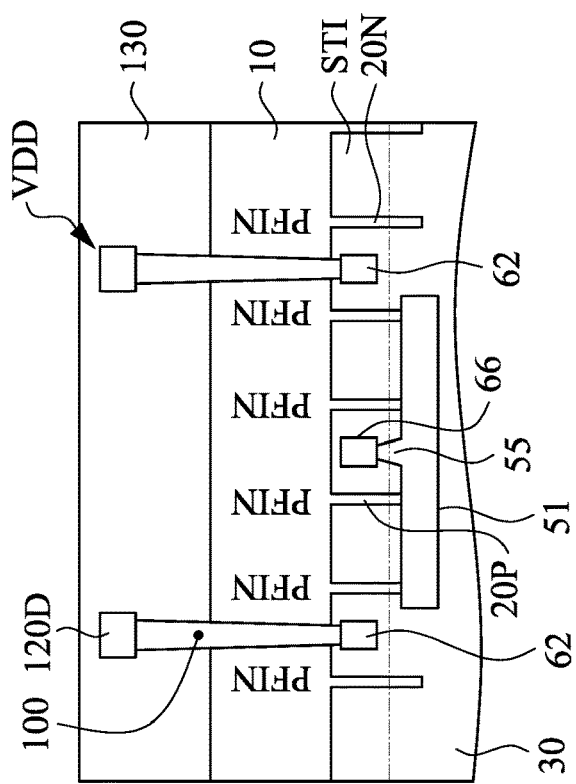

FIGS. 3C and 3D show cross sectional views of the semiconductor device with a back side power supply circuit according to an embodiment of the present disclosure. FIG. 3C corresponds to the line Y3-Y3 of FIG. 2A and FIG. 3D corresponds to the line Y4-Y4 of FIG. 2A.

On the back side surface of the substrate 10, a back side insulating layer 130 is disposed and first and second back side power supply wirings 120S and 120D are embedded in the back side insulting layer 130. In some embodiments, the back side insulating layer 130 includes one or more layers of insulating material. On the front side, a front side insulating layer 30 is disposed and a plurality of fin structures are embedded in the front side insulating layer 30. In some embodiments, the front side insulating layer 30 includes one or more layers of insulating material. One of the layers is an isolation insulating layer, such as shallow trench isolation (STI), in some embodiments.

As shown in FIGS. 3A-3D, the first to third buried power supply wirings 62, 64 and 66 are disposed between two adjacent fins and embedded in the isolation insulating layer. The first back side power supply wirings 120D for supplying the first potential Vdd is connected to the second buried power supply wiring 62 by one of more TSVs 100, and the second back side power supply wirings 120S for supplying the second potential Vss is connected to the third buried power supply wiring 64 by one of more TSVs 100.

The source/drain contact layers 50, 51 and 52 are disposed over the source/drain regions of the fins, respectively. In some embodiments, the source/drain regions of the fins include one or more semiconductor epitaxial layers and the source/drain contact layers 50, 51 and 52 is in contact with at least one of the semiconductor epitaxial layers. In other embodiments, the source/drain contact layers 50, 51 and 52 directly cover the source/drain regions of the fins, respectively. In other embodiments, the buried power supply wirings are coupled to the source/drain regions of the fins via upper layer wirings located above the source/drain contact layer connecting adjacent fins.

Figure 4:
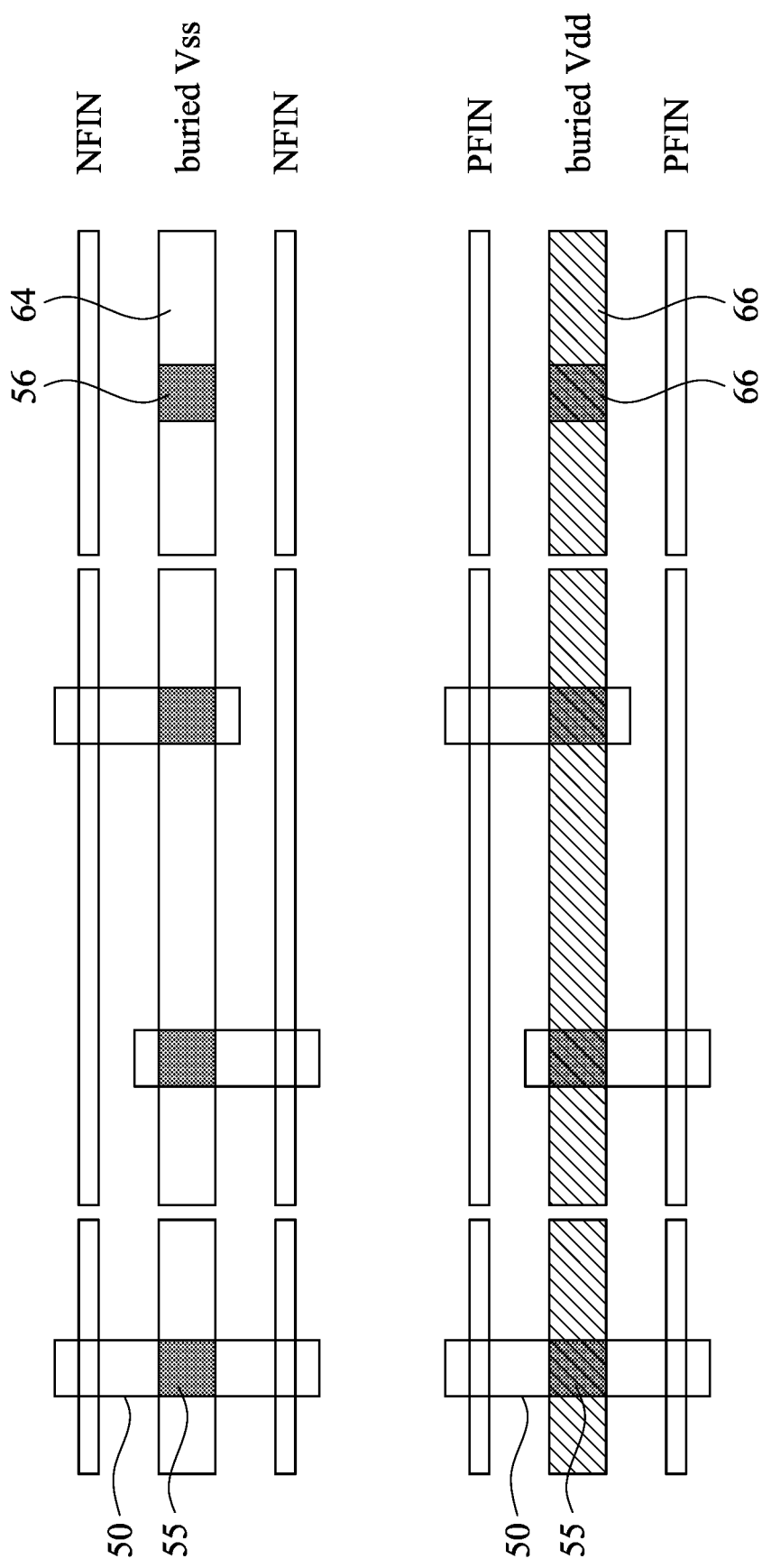
FIG. 4 shows various structures of a power switch circuit and a logic circuit according to embodiments of the present disclosure.

FIG. 4 shows various configurations connecting the buried power supply wiring and a source region of a fin in the logic circuit. In some embodiments, one source/drain contact layer 50 is connected to two fins (n-type fins or p-type fins) sandwiching the buried power supply wiring. In other embodiments, one source/drain contact layer 50 is connected to one of the two fins (n-type fins or p-type fins) sandwiching the buried power supply wiring, which is located in an upper row, and another source/drain contact layer 50 is connected to the other of the two fins, which is located in lower row. In some embodiments, one or more dummy patterns 56 are formed. In some embodiments, the plugs are disposed in a constant pitch.

Figure 5:
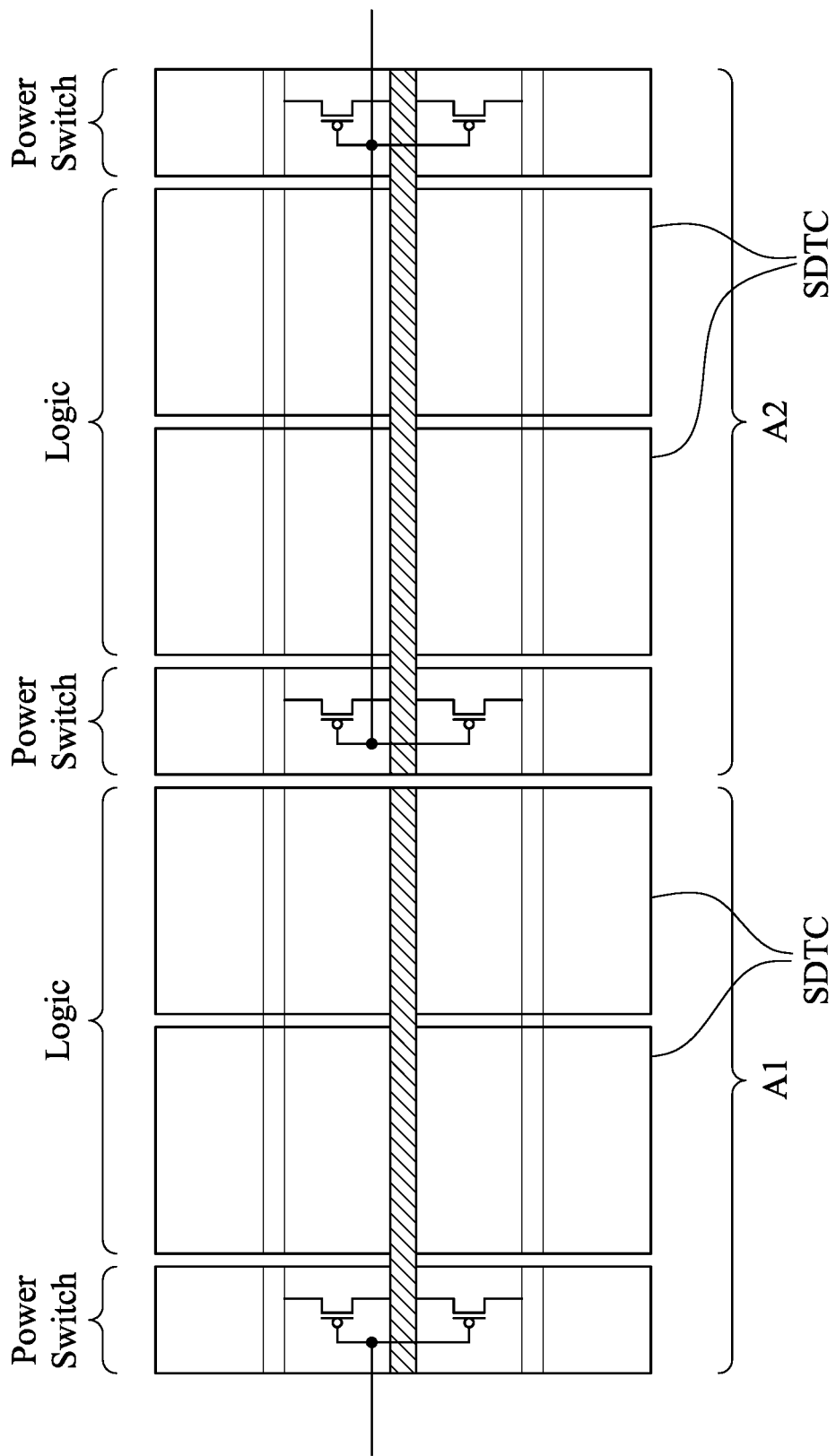
FIG. 5 shows a layout of power switch circuits and logic circuits according to an embodiment of the present disclosure.

FIG. 5 shows a layout of power supply circuits and logic circuits according to an embodiment of the present disclosure. In some embodiments, as shown in area A1 of FIG. 5, one power switch circuit is provided to one or more standard cells STDC of the logic circuit. In other embodiments, as shown in area A2 of FIG. 5, two power switch circuits sandwich one or more standard cells STDC of the logic circuit. In such a case, the first buried power supply wiring 66 is continuously disposed over the two power switch circuits and the logic circuit. The power switch circuits are independently controlled to selectively activate the corresponding logic circuit. The first buried power supply wiring 66 is discontinuous between independent power switch circuits in some embodiments.

Figure 6:
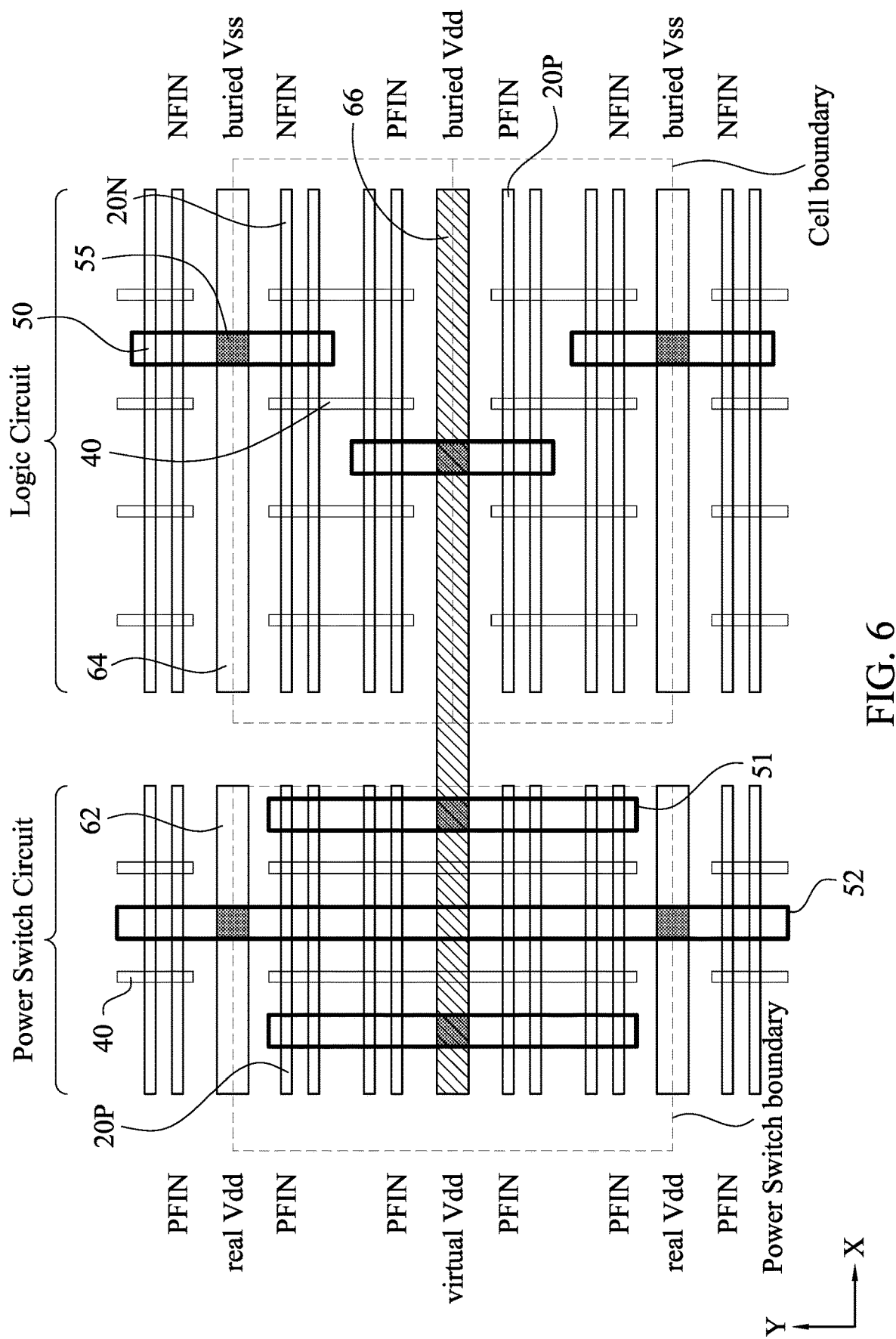
FIG. 6 shows a layout of a power switch circuit and a logic circuit according to an embodiment of the present disclosure.

FIG. 6 shows a layout of a power supply circuit and a logic circuit according to another embodiment of the present disclosure. In the layout of FIG. 2A, one Fin FET includes one fin (p-type or n-type). In the layout of FIG. 6, multiple fins (e.g., 2 or 3) are included in one Fin FET in the logic circuit. The pitch of the multiple fins is in a range from about 15 nm to about 25 nm depending on the design rule. Similarly, multiple p-type fins are disposed in the power switch circuit at the locations corresponding to the multiple fins of the logic circuit. This configuration increases driving current capacity.

Figure 7:
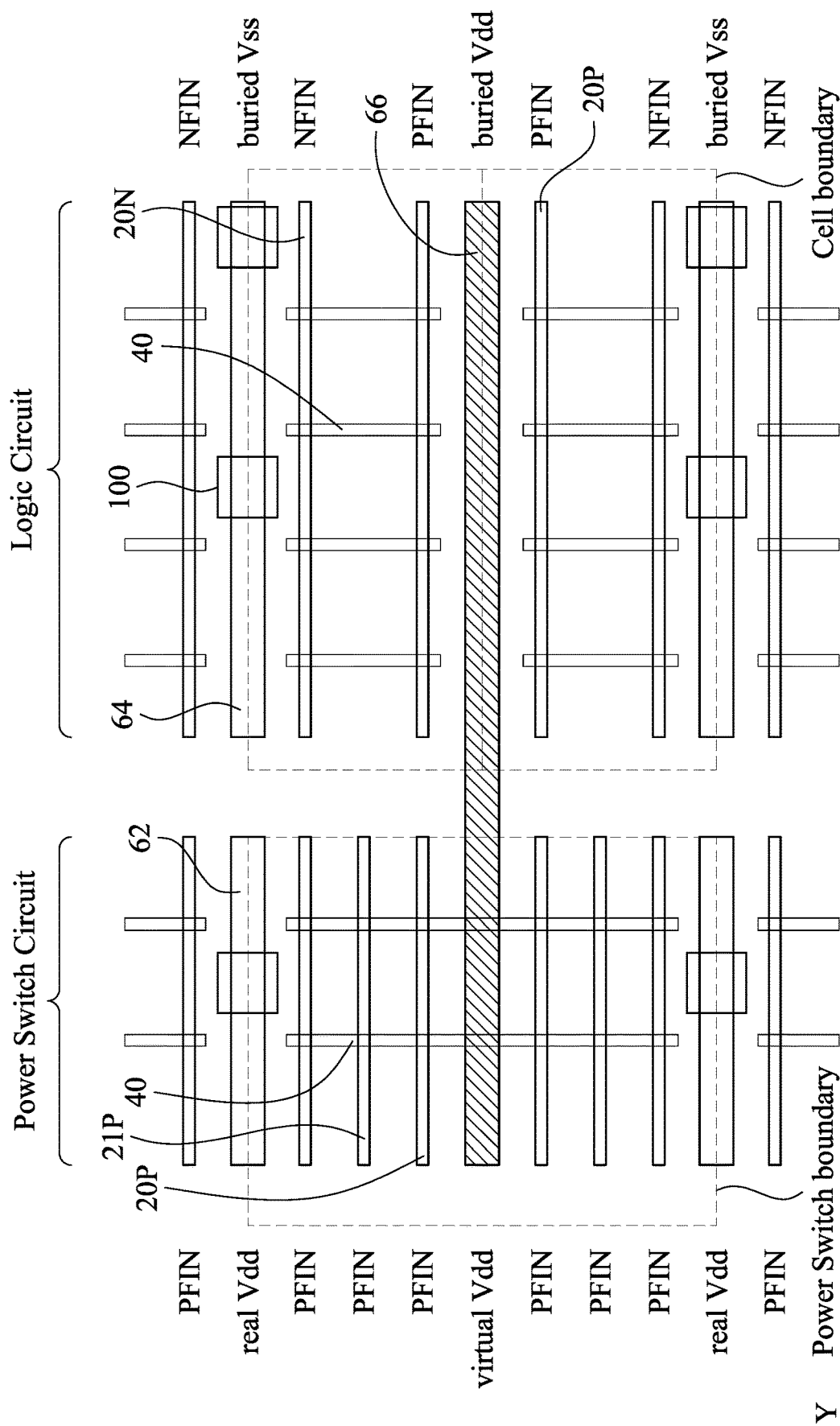
FIGS. 7 and 8 show layouts of a power switch circuit and a logic circuit according to an embodiment of the present disclosure.
Figure 8:
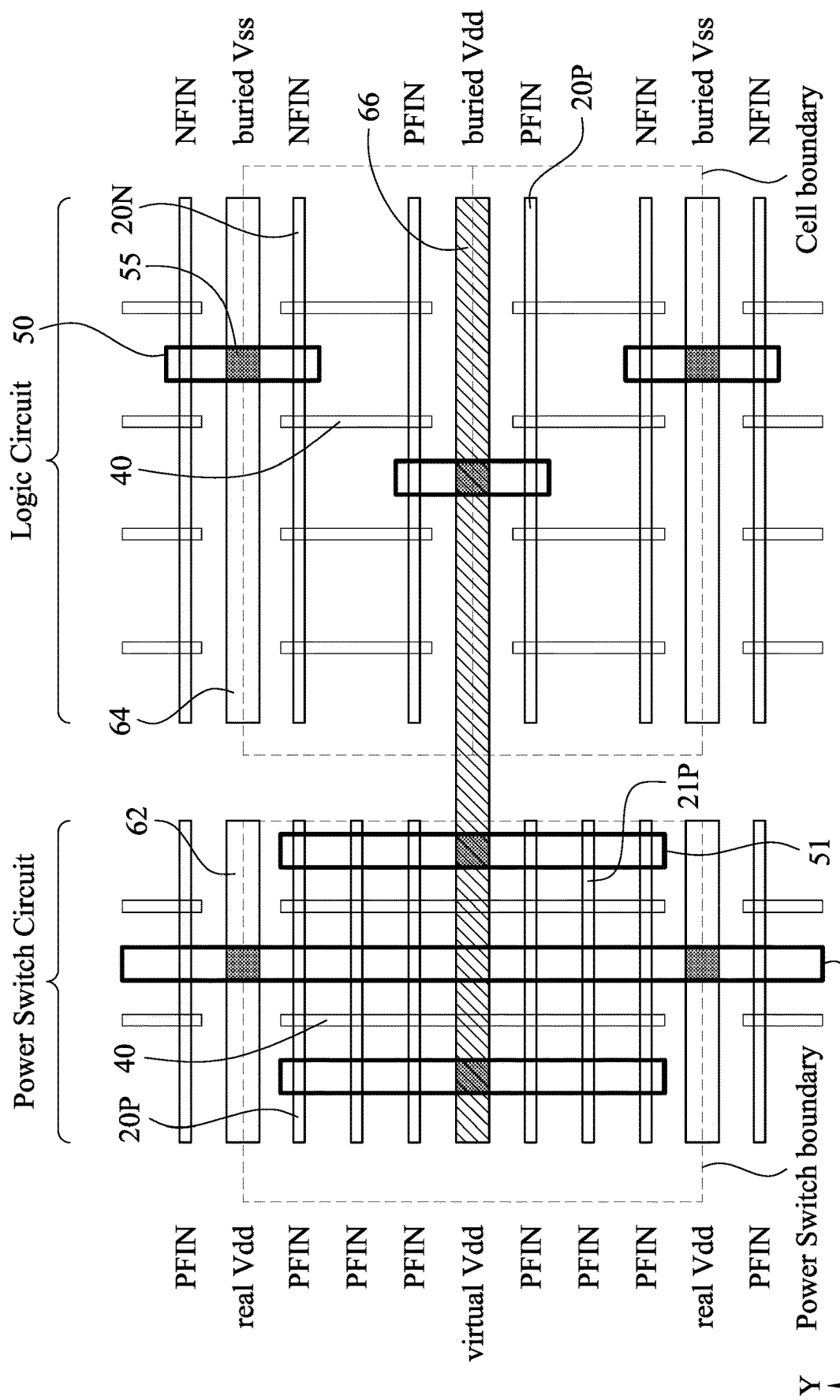

FIGS. 7 and 8 show layouts of a power switch circuit and a logic circuit according to another embodiment of the present disclosure. In the embodiments of FIGS. 7 and 8, additional p-type fins 21P are disposed between the p-type fins 20P shown in FIGS. 2A and 2B. The additional p-type fins 21P are not aligned with any fin in the logic circuit in the X direction in plan view. This configuration increases driving current capacity of the power switch circuit.

Figure 9A:
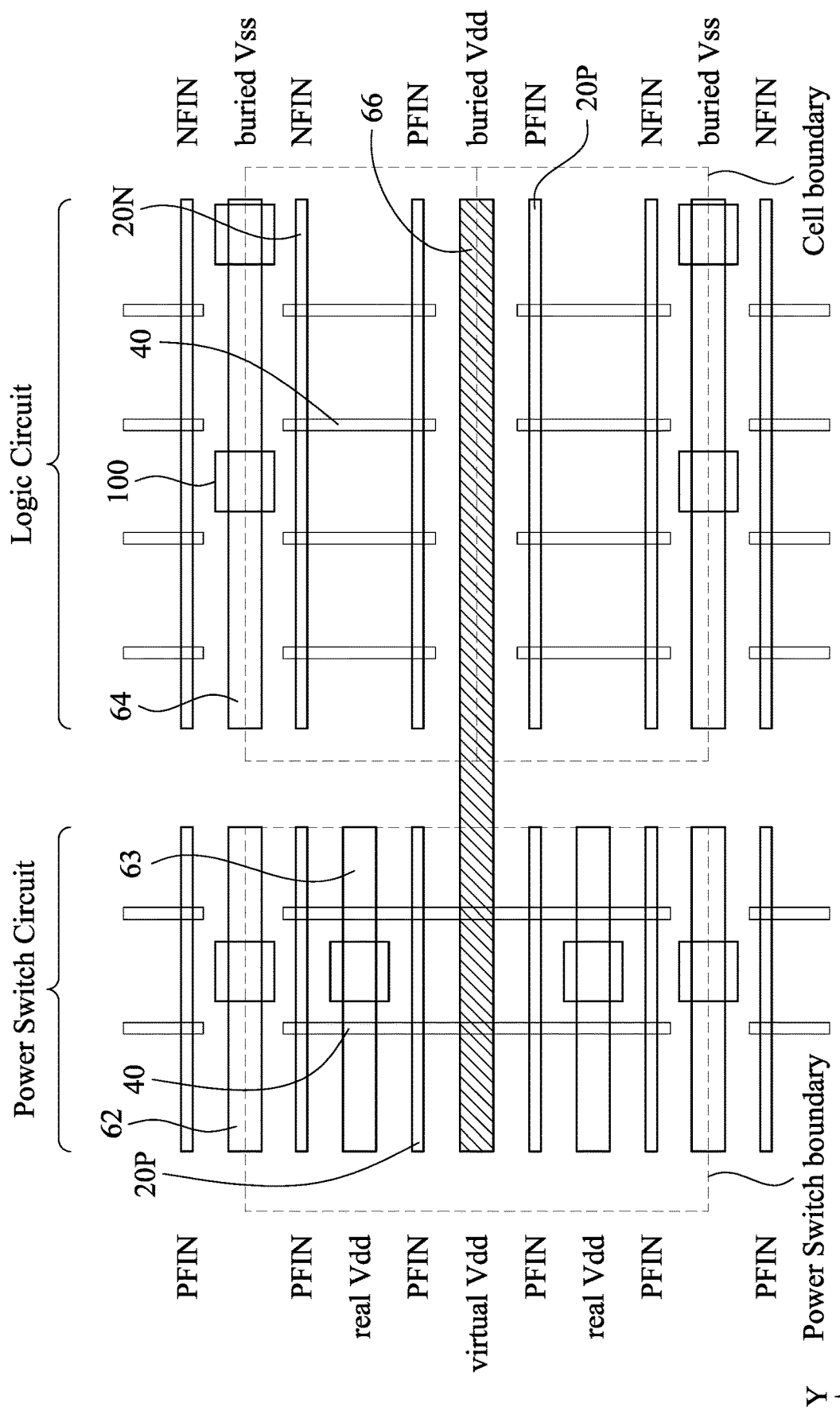
FIGS. 9A and 9B show layouts of a power switch circuit and a logic circuit according to an embodiment of the present disclosure.
Figure 9B:
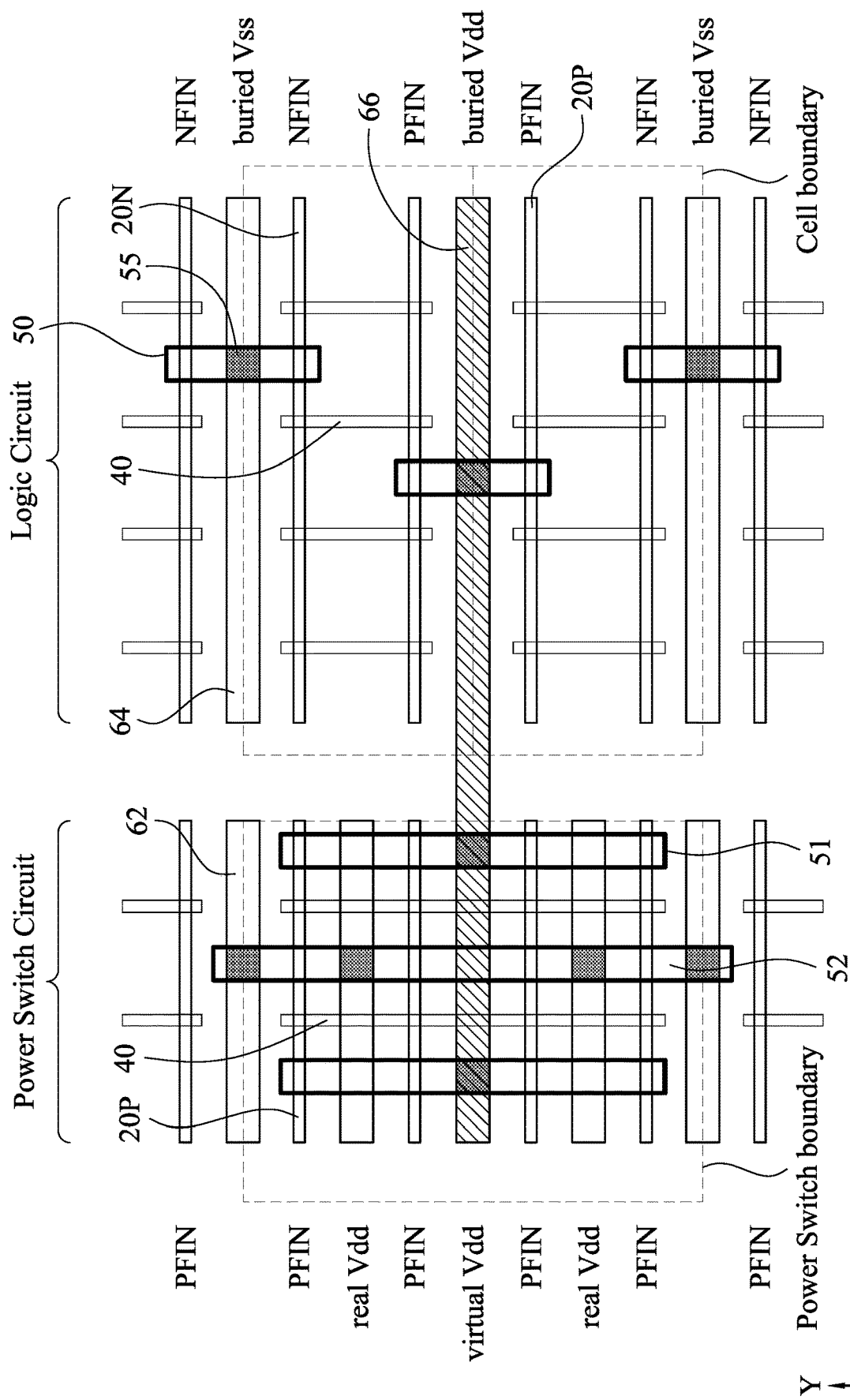

FIGS. 9A and 9B show layouts of a power switch circuit and a logic circuit according to another embodiment of the present disclosure. In the embodiments of FIGS. 9A and 9B, additional second buried power supply wirings 63 are provided between existing second buried power supply wirings 62 and the first buried power supply wiring 66. Additional back side first power supply wirings (not shown) are provided at the back side and connected to the additional second buried power supply wirings 63 by one or more TSVs 100. The additional second buried power supply wiring 63 is not aligned to any fin and any buried power supply wiring in the logic circuit in the X direction in plan view. This configuration decreases resistance of the first power supplying route and improves reliability, such as electro migration.

Figure 10A:
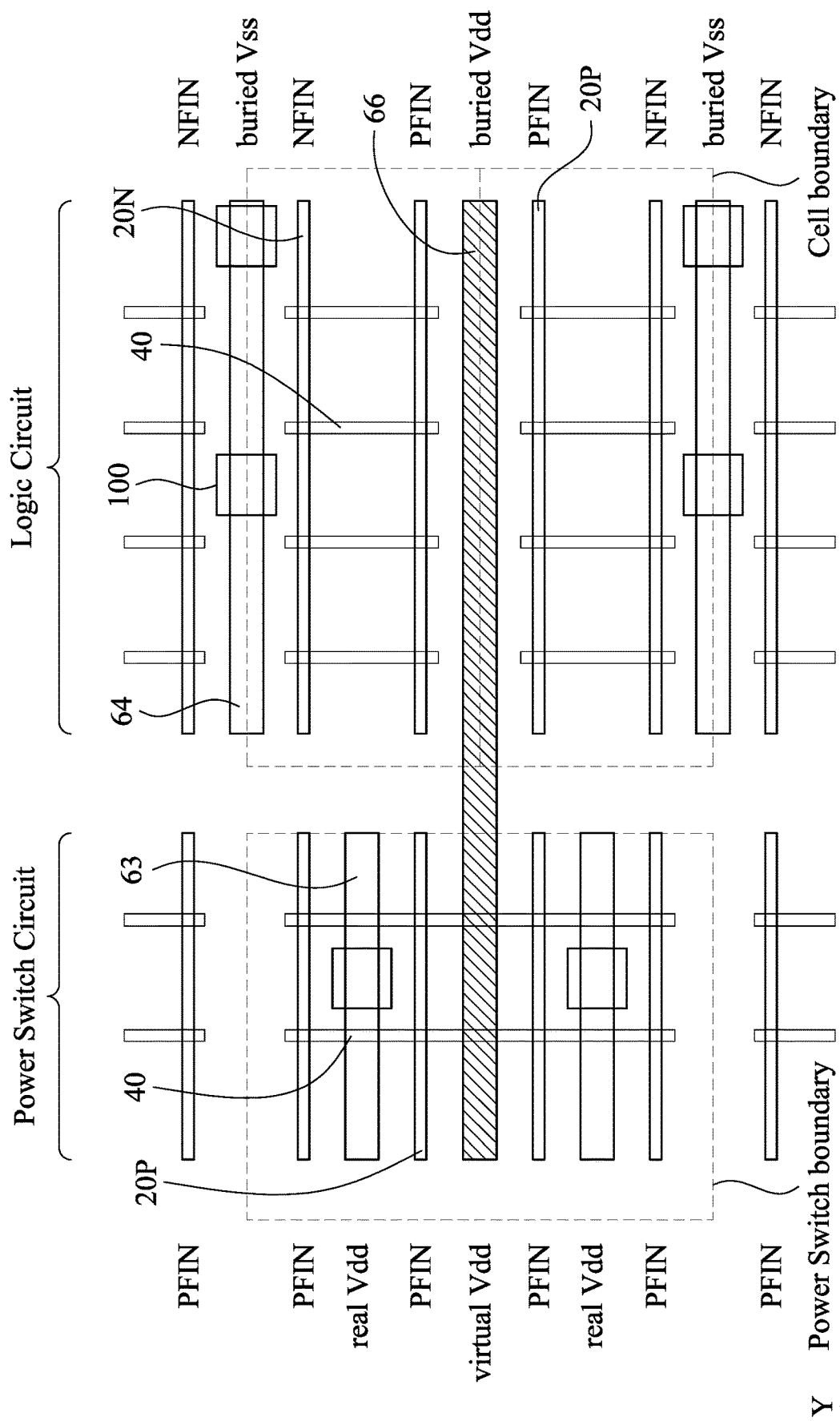
FIGS. 10A and 10B show layouts of a power switch circuit and a logic circuit according to an embodiment of the present disclosure.
Figure 10B:
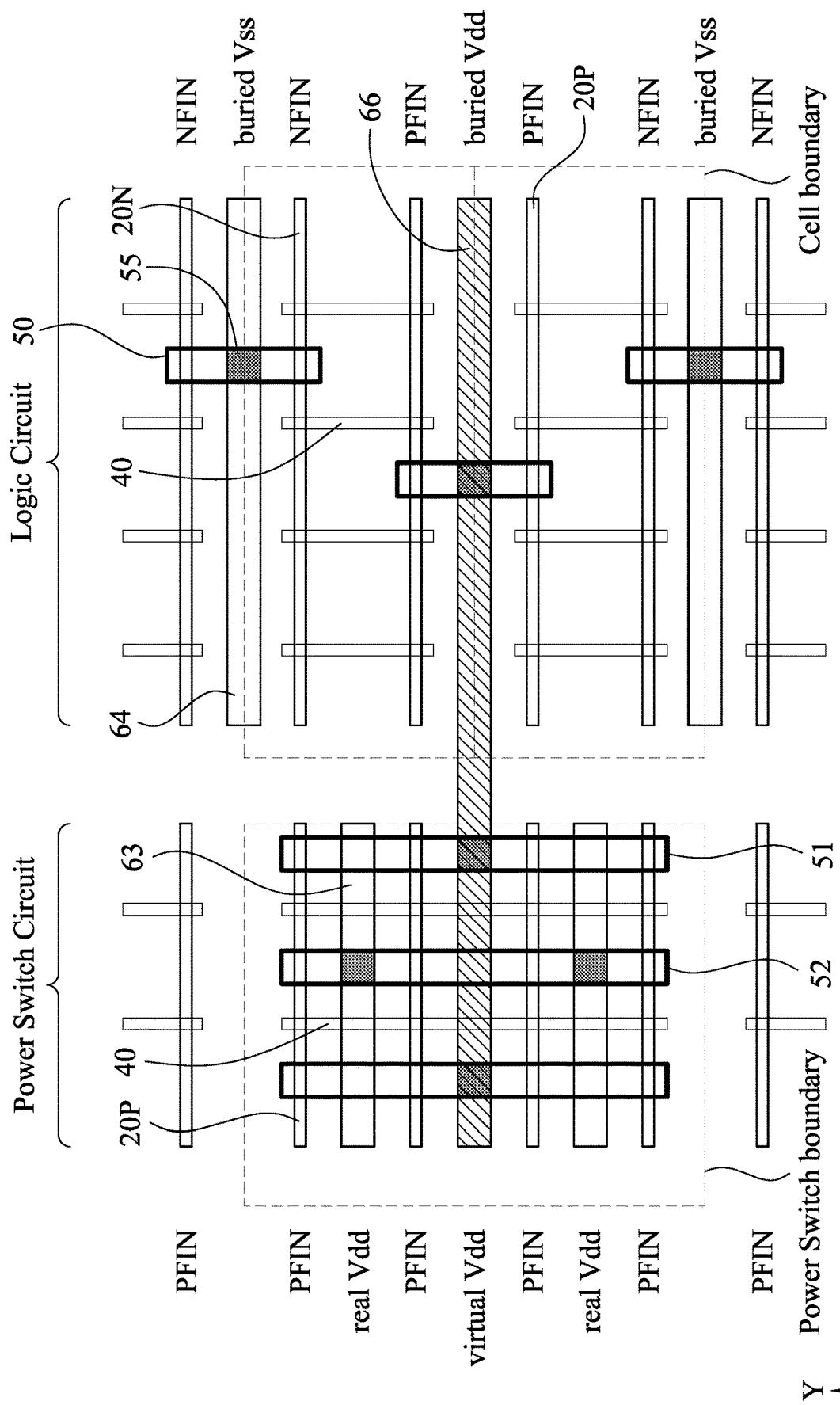

FIGS. 10A and 10B show layouts of a power switch circuit and a logic circuit according to another embodiment of the present disclosure. In the embodiments of FIGS. 10A and 10B, second buried power supply wirings 63 are provided instead of second buried power supply wirings 62. Accordingly, the second buried power supply wiring 63 is separated from and is not aligned with the third buried power supply wiring 64 in the X direction in plan view.

Figure 11:
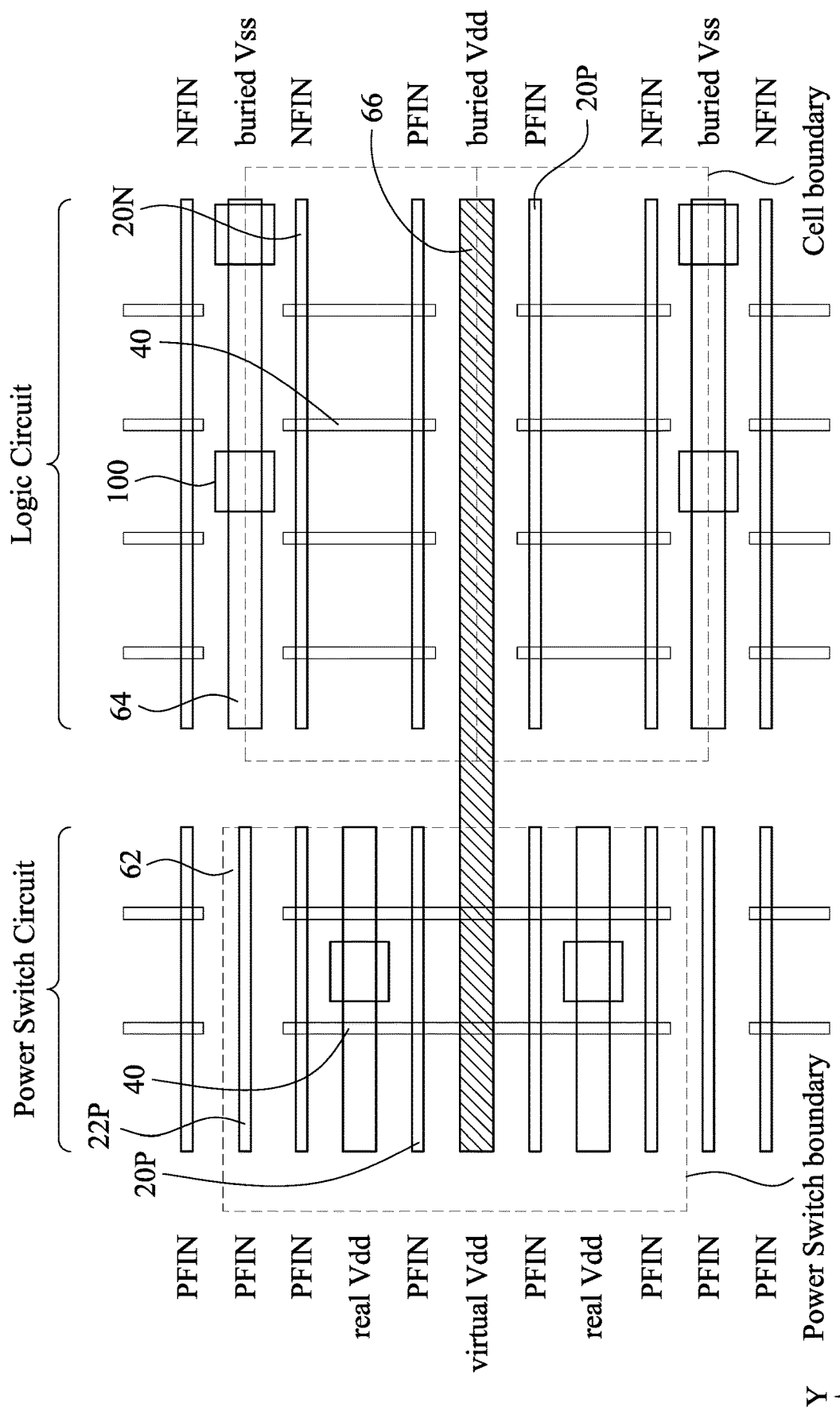
FIGS. 11 and 12 show layouts of a power switch circuit according to an embodiment of the present disclosure.
Figure 12:
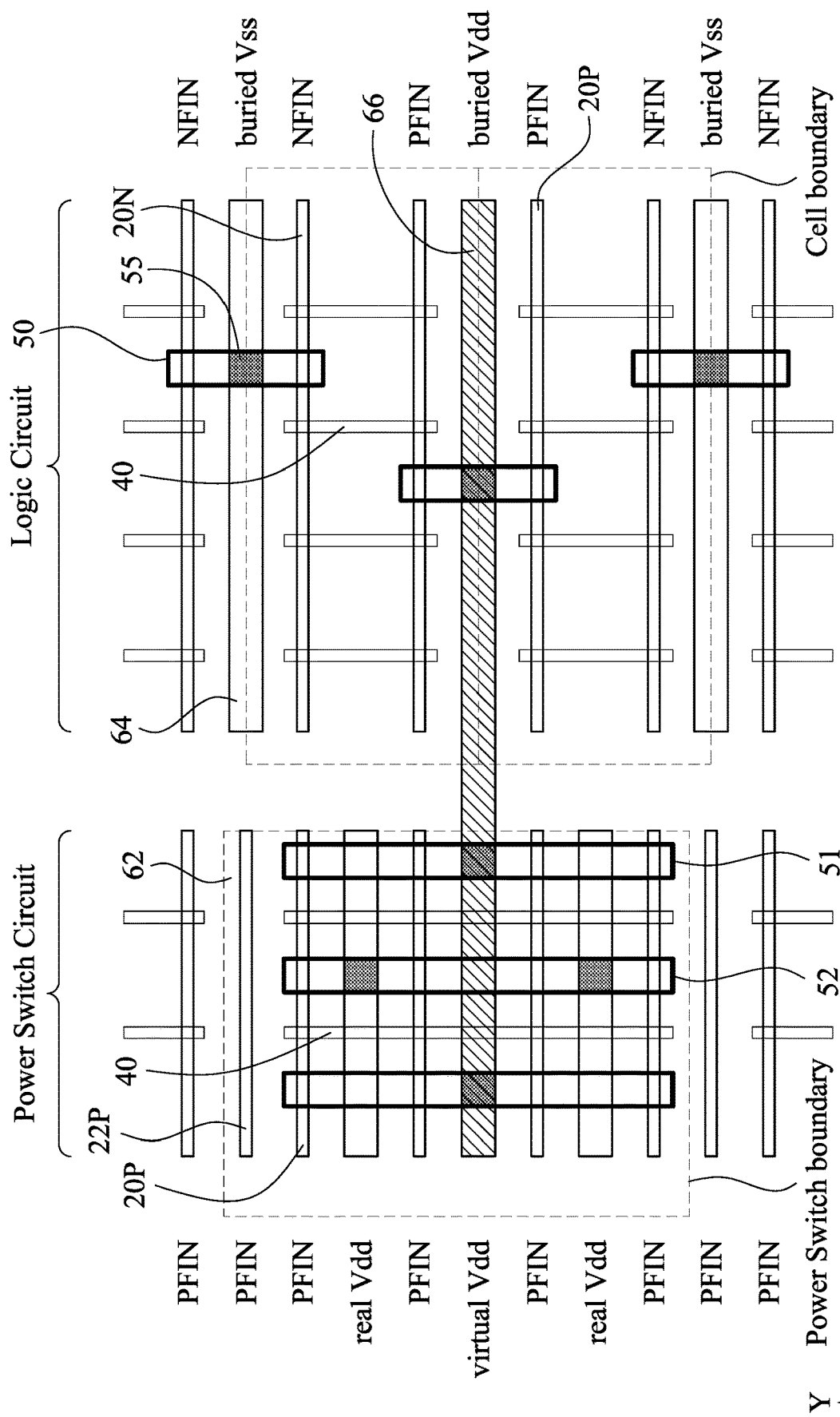

FIGS. 11 and 12 show layouts of a power switch circuit and a logic circuit according to another embodiment of the present disclosure. In the embodiments of FIGS. 11 and 12, in addition to the layout shown in FIGS. 9A and 9B, additional p-type fins 22P are provided at the locations where the second buried power supply wirings 62 are disposed. In other words, the second buried power supply wirings 62 are replaced with the additional p-type fins 22P. The additional p-type fin 22P is aligned with the third buried power supply wiring 64 in the X direction in plan view in some embodiments. In this configuration, the boundary of the power switch circuit shifts in the Y direction as shown in FIGS. 11 and 12, and the layout of the power switch circuit is not symmetric with respect to the first buried power supply wiring 66.

FIGS. 13A-17B shows sequential manufacturing operations for buried power supply wirings 60 according to an embodiment of the present disclosure. It is understood that additional operations can be provided before, during, and after the processes shown by FIGS. 13A-17B, and some of the operations described below can be replaced or eliminated, for additional embodiments of the method. The order of the operations/processes may be interchangeable.

Figure 13A:
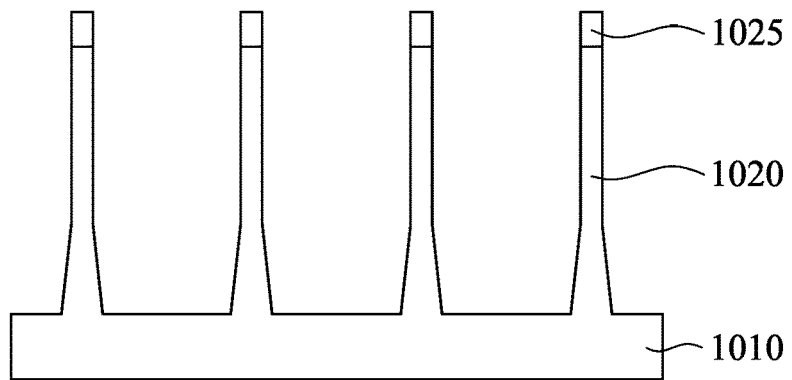
FIGS. 13A, 13B and 13C show cross sectional views illustrating manufacturing operations of buried power wirings of a front side circuit according to an embodiment of the present disclosure.

As shown in FIG. 13A, a front side circuit is formed over a front surface of the main (first) substrate 1010. The front side circuit includes one or more fin structures 1020 formed over the semiconductor substrate 1010. In some embodiments, the substrate 1010 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenide phosphide (GaAsP), or gallium indium phosphide (GaInP)), or the like. Further, the substrate 1010 may include one or more epitaxial layers (epi-layers), which may be strained for performance enhancement, and/or may include buried insulating layers to form a silicon-on-insulator (SOI) structure.

The fin structures 1020 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned into mandrels using a photolithography process. Spacers are formed alongside the mandrels using a self-aligned process. The mandrels are then removed, and the remaining spacers-may then be used to pattern the fin structures. The multi-patterning processes combining photolithography and self-aligned processes generally result in forming a pair of fin structures. In FIG. 13A, four fin structures 1020 are illustrated. However, the number of the fin structures is not limited to four. In some embodiments, one or more dummy fin structures are formed adjacent to the fin structure 1020 of an active FinFET. FIG. 13A also shows a hard mask 1025 used to pattern the fin structures 1020.

Figure 13B:
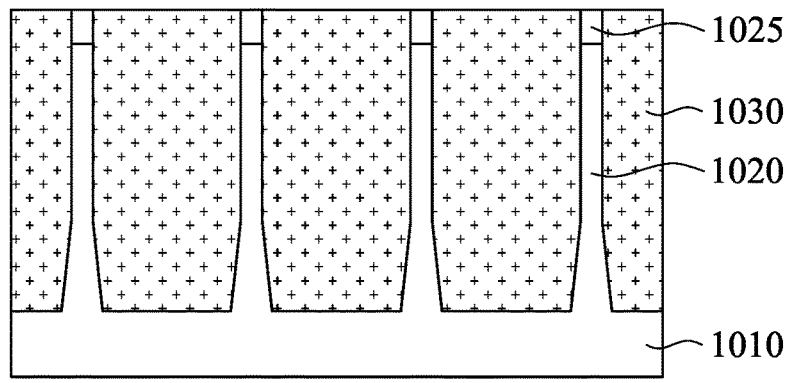

Then, as shown in FIG. 13B, an insulating layer for shallow trench isolation (STI) is formed to embed the fin structures 1020 therein. The insulating layer 1030 includes one or more layers of insulating materials, for example, silicon dioxide, silicon oxynitride and/or silicon nitride formed by LPCVD (low pressure chemical vapor deposition), plasma-enhanced (PE) CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 1030 can be formed by one or more layers of SOG, SiO, SiON, SiOCN or fluorine-doped silicate glass (FSG) in some embodiments. Prior to forming the isolation insulating region 1030, one or more liner layers (not shown) are formed over the substrate 1010 and sidewalls of the bottom part of the fin structures 1020, in some embodiments.

Figure 13C:
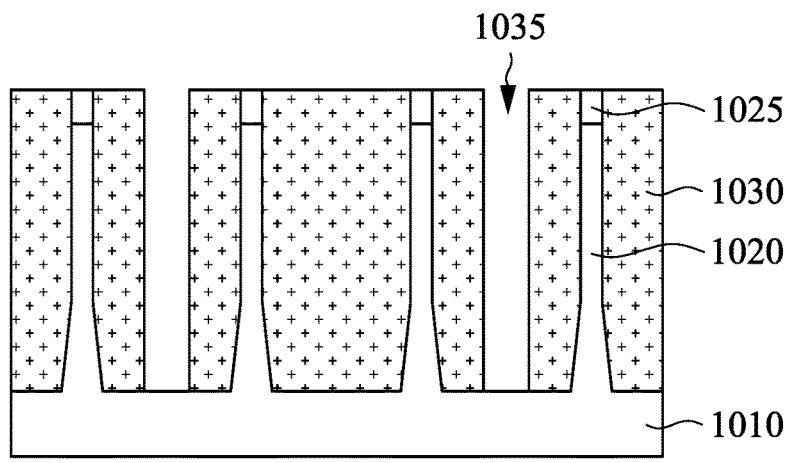

Next as shown in FIG. 13C, trench openings 1035 are formed in the isolation insulating layer 1030 by using one or more lithography and etching operations.

Figure 14A:
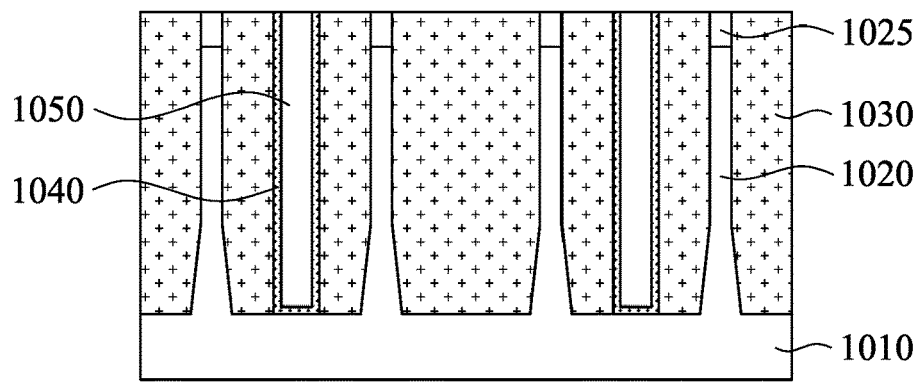
FIGS. 14A, 14B and 14C show cross sectional views illustrating manufacturing operations of buried power wirings of a front side circuit according to an embodiment of the present disclosure.

In some embodiments, after a liner insulating layer 1040 is formed in the trench opening, a conductive material 1050 is filled in the trench opening as shown in FIG. 14A. The liner layer 1040 includes one or more of silicon oxide, silicon nitride, SiON, SiOC, SiOCN or any other suitable material. The conductive material 1050 includes one or more conductive materials, such as doped poly silicon, W, Cu, Ti, Ag, Al, TiAl, TiAlN, TaC, TaCN, TaSiN, Mn, Co, Mo, Pd, Ni, Re, Ir, Ru, Pt, and Zr, formed by ALD, PVD, CVD, plating or any other suitable methods. After the conductive material 1050 is formed a planarization operation, such as a chemical mechanical polishing (CMP) operation is performed.

Figure 14B:
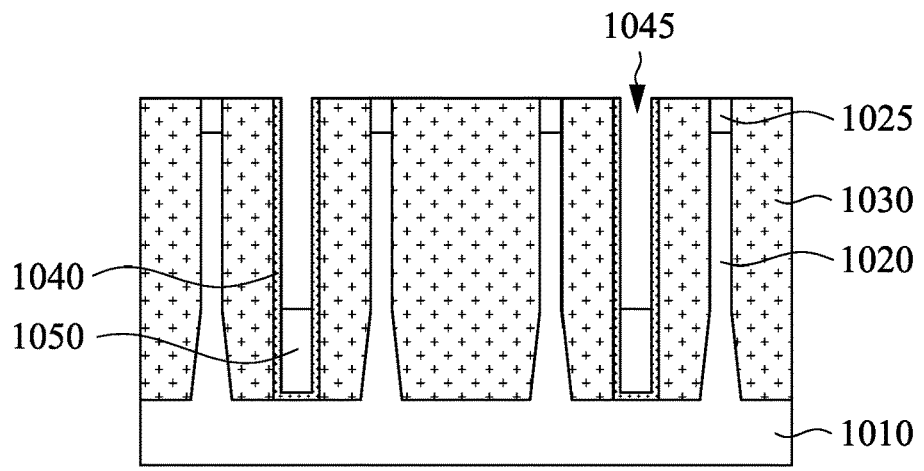
Figure 14C:
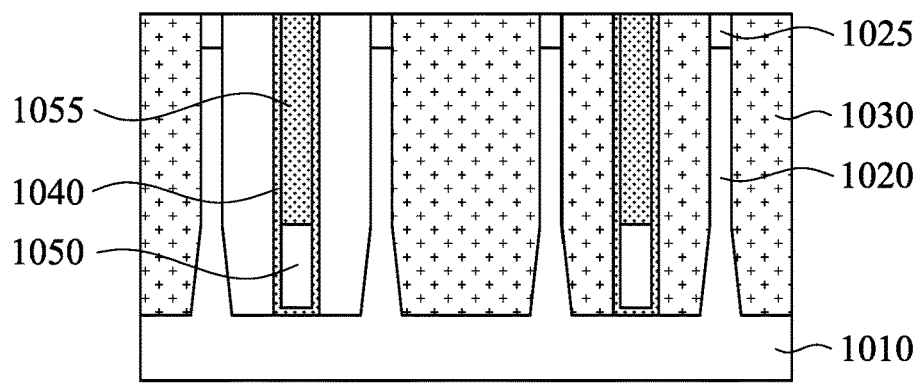

Subsequently, as shown in FIG. 14B, the conductive material 1050 is recessed down to a given depth to form upper openings 1045. The upper openings 1045 are filled with an insulating material 1055 as shown in FIG. 14C. The insulating material 1055 includes one or more of silicon oxide, silicon nitride, SiON, SiOC, SiOCN or any other suitable material.

Figure 15A:
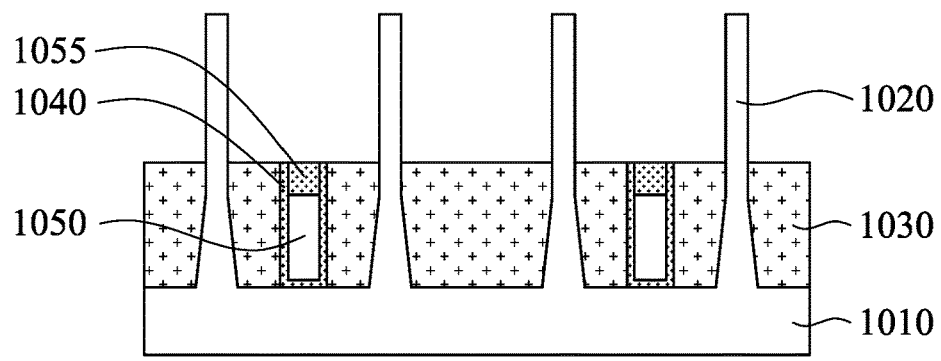
FIGS. 15A, 15B and 15C show various views illustrating manufacturing operations of buried power wirings of a front side circuit according to an embodiment of the present disclosure.
Figure 15B:
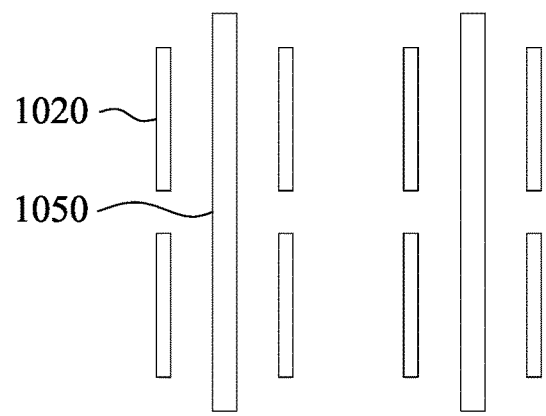
Figure 15C:
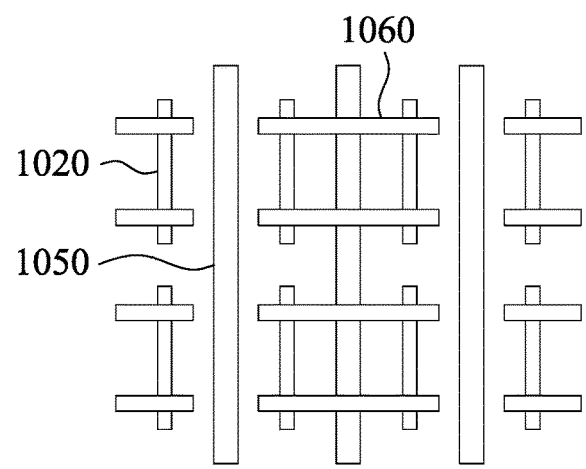

After the insulating material 1055 is formed, an etch back operation is performed to expose the upper portion of the fin structures 1020. In some embodiments, the isolation insulating layer 1030, the liner layer 1040 and the insulating material 1055 are recessed using a single etch process, or multiple etch processes, including a dry etch, a chemical etch, or a wet cleaning process. As shown in FIG. 15A, part of the insulating material 1055 remains on the conductive material 1050, which corresponds to a buried power supply wiring 60. FIG. 15B shows a plan view after the buried power supply wirings 1050 (60) are formed. Next, as shown in FIG. 15C, one or more gate electrodes 1060 are formed. In some embodiments, the gate electrodes 1060 are sacrificial gate electrodes, which are subsequently replaced with metal gate electrodes. In some embodiments, the buried power supply wirings are cut into pieces of wirings for different potentials.

After the gate electrodes 1060 are formed, the fin structures 1020 at the source/drain regions are recessed and then source/drain epitaxial layers 1070 are formed. The materials used for the source/drain epitaxial layer 1070 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer 1070 includes two or more epitaxial layers with different compositions and/or different dopant concentrations. The source/drain epitaxial layer 1070 can be formed by CVD, ALD, molecular beam epitaxy (MBE), or any other suitable methods.

After the source/drain epitaxial layer 1070 is formed, an interlayer dielectric (ILD) layer 1080 is formed. In some embodiments, before forming the ILD layer, an etch stop layer (not shown) is formed over the source/drain epitaxial layer 1070 and the gate electrodes 1060. The etch stop layer is made of silicon nitride or a silicon nitride-based material (e.g., SiON, SiCN or SiOCN). The materials for the ILD layer include compounds comprising Si, O, C and/or H, such as silicon oxide, SiCOH and SiOC. Organic materials, such as polymers, may be used for the ILD layer 1080. After the ILD layer 1080 is formed, a planarization operation, such as an etch-back process and/or a chemical mechanical polishing (CMP) process, is performed.

Figure 16A:
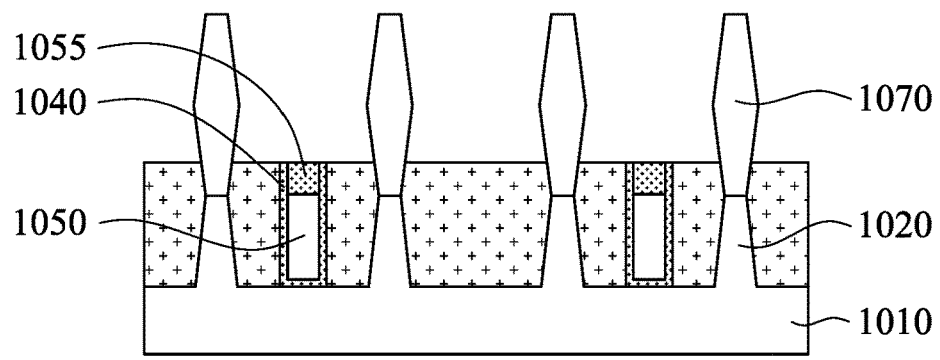
FIGS. 16A, 16B and 16C show cross sectional views illustrating manufacturing operations of buried power wirings of a front side circuit according to an embodiment of the present disclosure.
Figure 16B:
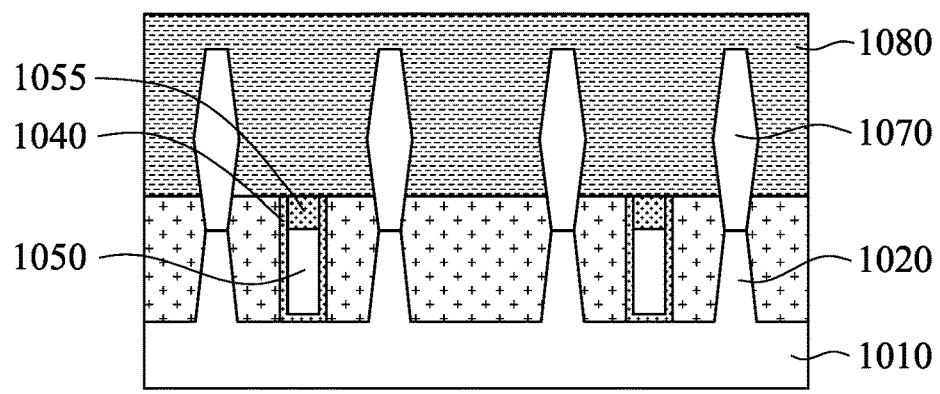
Figure 16C:
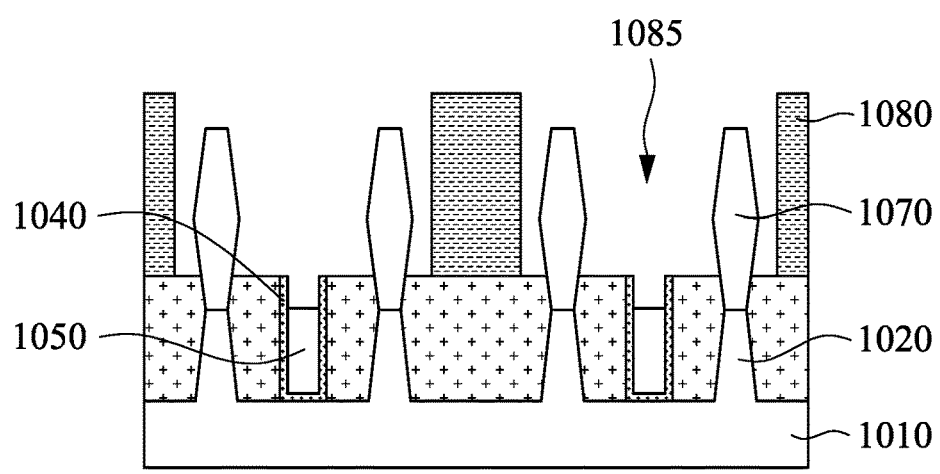
Figure 17A:
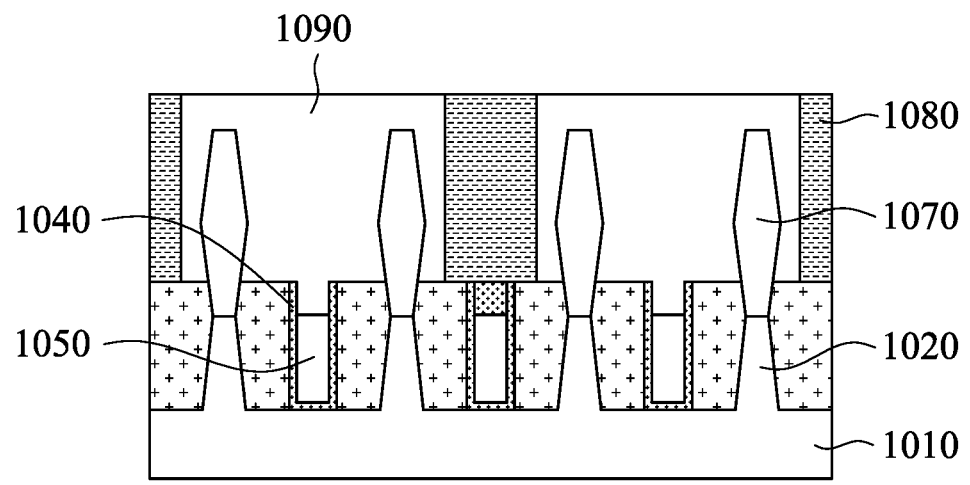
FIGS. 17A and 17B show various views illustrating manufacturing operations of buried power wirings of a front side circuit according to an embodiment of the present disclosure.
Figure 17B:
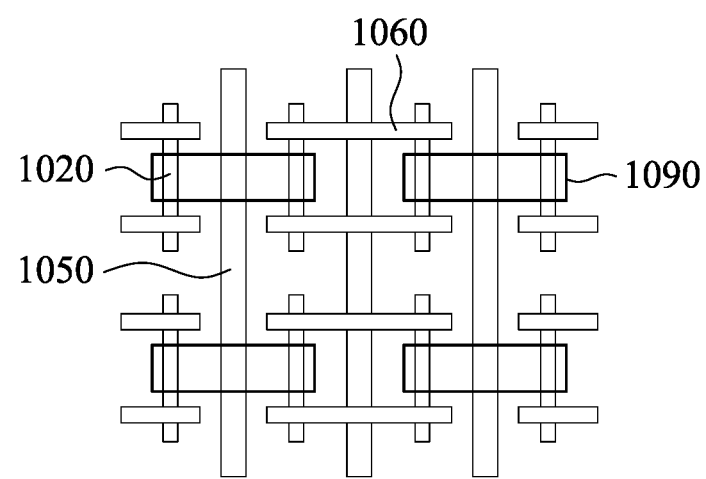

Then, as shown in FIG. 16C, the ILD layer 1080 is patterned to expose part of the source/drain epitaxial layer 1070 to form openings 1085 by using one or more lithography and etching operations. In this etching, the insulating material 1055 is also removed and thus the buried power supply wiring 1050 is exposed in the opening 1085. The openings 1085 are filled with a conductive material 1090 as show in FIG. 17A. The conductive material 1090 connects the source/drain epitaxial layer 1070 and the buried power supply wiring 1050. The conductive material 1090 corresponds to the source/drain contact pattern 50 or 52. FIG. 17B shows a plan view after the source/drain contact patterns 1090 (50/52) are formed. When the gate electrodes 1060 are sacrificial gate electrodes, a gate replacement operation is performed to replace the sacrificial gate electrodes with metal gate electrodes.

FIGS. 18A-19C shows a sequential manufacturing operation for the back side power supply circuit and TSVs according to an embodiment of the present disclosure. It is understood that additional operations can be provided before, during, and after the processes shown by FIGS. 18A-19C, and some of the operations described below can be replaced or eliminated, for additional embodiments of the method. The order of the operations/processes may be interchangeable.

After the gate electrodes (metal gate electrode) are formed, and interconnect layer 1100 comprising multiple layers of metal wiring structures embedded in interlayer dielectrics (ILD) is formed over the gate electrodes. As shown in FIG. 18A, a second substrate 1210 (e.g., Si) with an insulating layer 1220 (e.g., silicon oxide) is attached to the top of the interconnect layer 1100. Then, the combined structure is flipped, and as shown in FIGS. 18B and 18C, the back side of the substrate 1010 is thinned by, for example, etch-back or CMP.

Figure 19C:
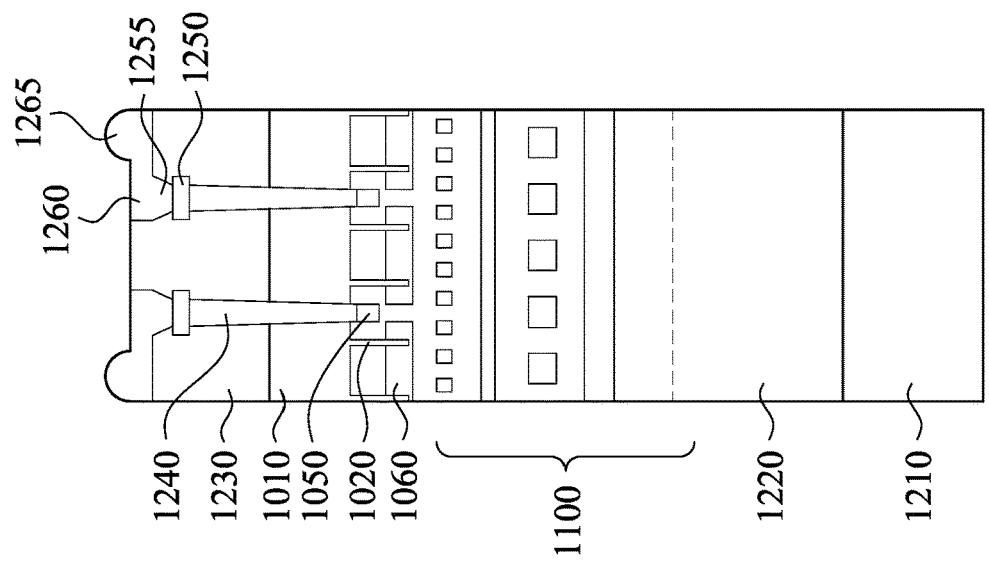
FIGS. 19A, 19B and 19C show cross sectional views illustrating manufacturing operations of a semiconductor device with a backside power switch circuit according to an embodiment of the present disclosure.
Figure 19B:
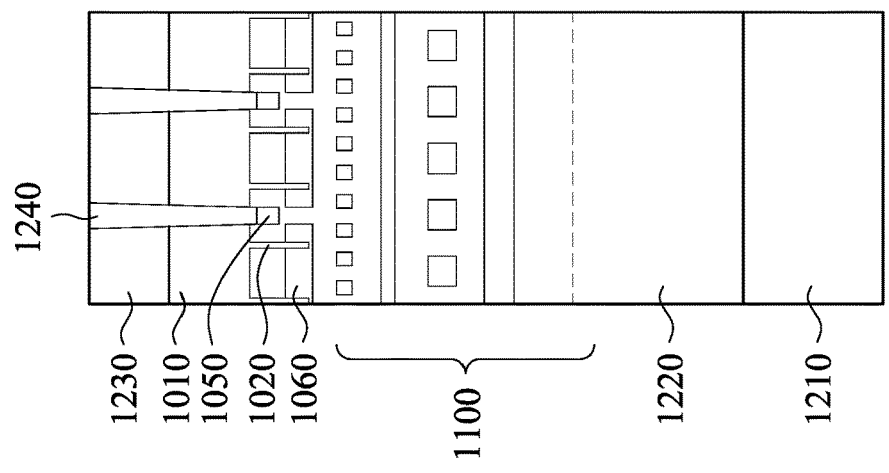
Figure 19A:
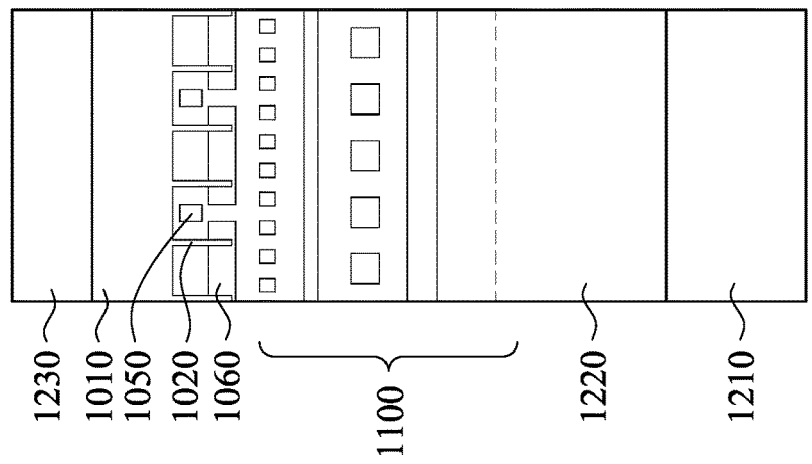

After the substrate 1010 is thinned, a first back side ILD layer 1230 (corresponding to ILD layer 132 in some embodiments) is formed as shown in FIG. 19A. Then, by using one or more lithography and etching operations, via holes for TSVs are formed passing through the first back side ILD layer 1230 and the thinned substrate 1010, and the holes are filled with a conductive material to form TSVs 1240 (corresponding to TSV 100) as shown in FIG. 19B. The TSVs 1240 are coupled to the buried power supply wirings 1050. Subsequently, power supply wirings 1250 (corresponding to back side power supply wirings 120S, 120D) are formed as shown in FIG. 19C. Further, in some embodiments, additional back side wirings 1260 connected to the wirings 1250 through back side vias 1255 are formed, and electrodes (bump) 1265 are formed to connect outside circuitry.

FIG. 20 shows a flow of a manufacturing operation of a semiconductor device with a backside power supply circuit according to an embodiment of the present disclosure. It is understood that additional operations can be provided before, during, and after the process flow shown by FIG. 20, and some of the operations described below can be replaced or eliminated, for additional embodiments of the method. The order of the operations/processes may be interchangeable. Materials, configurations, dimensions, processes and/or operations as explained with respect to the foregoing embodiments may be employed in the following embodiments, and the detailed description thereon may be omitted.

At S2010, a front side circuit is manufactured on a first substrate. The front side circuit includes FinFETs, buried power supply wirings and a multi-layer wiring structure as set forth above. Then at S2020, a second substrate with an insulating layer is attached to the front side of the first substrate, and the first substrate is thinned. At S2030, TSVs are formed to be connected to the buried power supply wirings. In some embodiments, some of the TSVs are connected other circuit elements than the buried power supply wirings. At S2040, the back side power supply wirings are formed. After the power supply wirings are formed, one or more ILD layers are formed, and at S2050, electrodes to be connected to outside and other wirings are formed.

In the foregoing embodiments, a power switching circuit including PMOS FETs is provided between the first main power supply wiring (VDD) 62 and the local power supply wiring (VVDD) 66. In other embodiments, alternatively or in addition to the foregoing embodiments, a power switching circuit including NMOS FETs is provided between the second main power supply wiring VSS and a local power supply VVSS (see FIG. 1). One of ordinary skill in the art would understand how to modify the circuits and/or structures as set forth above to realize a power switching circuit including NMOS FETs provided between the second main power supply wiring VSS and a local power supply VVSS.

In the present embodiments, since a power switching circuit for switching power supply from the main power supply (VDD or VSS) to the local power supply (VVDD or VVSS) and power supply wirings are located at the back side of the substrate, it is possible to reduce a cell height of the standard cells.

It will be understood that not all advantages have been necessarily discussed herein, no particular advantage is required for all embodiments or examples, and other embodiments or examples may offer different advantages.

In accordance with an aspect of the present disclosure, a semiconductor device includes a substrate, a front side circuit disposed over a front surface of the substrate, and a backside power delivery circuit disposed over a back surface of the substrate and including a first back side power supply wiring coupled to a first potential. The front side circuit includes a plurality of semiconductor fins and a first front side insulating layer covering bottom portions of the plurality of semiconductor fins, a plurality of buried power supply wirings embedded in the first front side insulating layer, the plurality of buried power supply wirings including a first buried power supply wiring and a second buried power supply wiring, and a power switch configured to electrically connect and disconnect the first buried power supply wiring and the second buried power supply wiring. The second buried power supply wiring is connected to the first back side power supply wiring by a first through-silicon via (TSV) passing through the substrate. In one or more of the foregoing and/or following embodiments, the backside power delivery circuit includes a second back side power supply coupled to a second potential different from the first potential, the plurality of buried power supply wirings includes a third buried power supply wiring, and the third buried power supply wiring is connected to the second back side power supply wiring by a second TSV. In one or more of the foregoing and/or following embodiments, the plurality of buried power supply wirings extend in a first direction, and the second buried power supply wiring is separated from and aligned with the third buried power supply wiring in the first direction. In one or more of the foregoing and/or following embodiments, the semiconductor device further includes a power switch area and a logic circuit area. The power switch area includes the power switch, the second buried power supply wiring and the first TSV, the logic circuit area includes the third buried power supply wiring and the second TSV, and the first buried power supply wiring is continuously disposed in the power switch area and the logic circuit area. In one or more of the foregoing and/or following embodiments, the power switch area includes only one conductivity type fin field effect transistors (FinFETs), and the logic circuit area includes a CMOS circuit. In one or more of the foregoing and/or following embodiments, no TSV is connected to the first buried power supply wiring. In one or more of the foregoing and/or following embodiments, the plurality of buried power supply wirings extend in a first direction, and the second buried power supply wiring is separated from and is not aligned with the third buried power supply wiring in the first direction in plan view. In one or more of the foregoing and/or following embodiments, one of the plurality of semiconductor fins is aligned with the third buried power supply wiring in the first direction in plan view. In one or more of the foregoing and/or following embodiments, the power switch includes a fin field effect transistor (FinFET), and a source of the FinFET is connected to the second buried power supply wiring and a drain of the FinFET is connected to the first buried power supply wiring.

In accordance with another aspect of the present disclosure, a semiconductor device includes a power switch area and a logic circuit area. The semiconductor device includes a substrate, and a front side circuit disposed over a front surface of the substrate. The front side circuit includes a plurality of semiconductor fins and a first front side insulating layer covering bottom portions of the plurality of semiconductor fins, a plurality of buried power supply wirings embedded in the first front side insulating layer and extending in a first direction. The plurality of buried power supply wirings including a first buried power supply wiring. A pair of second buried power supply wirings sandwiches the first buried power supply wiring, a third buried power supply wiring. A pair of fourth buried power supply wirings sandwiches the third buried power supply wiring. The power switch area of the front side circuit includes the first buried power supply wiring, the pair of second buried power supply wirings, and a power switch configured to electrically connect and disconnect the first buried power supply wiring and the pair of second buried power supply wirings. The logic circuit area of the front side circuit includes the third buried power supply wiring, and the pair of fourth buried power supply wirings. The pair of second buried power supply wirings are separated from the pair of fourth buried power supply wirings, respectively, and the first buried power supply wiring and the third buried power supply wirings form one continuously extending wiring disposed in the power switch area and the logic circuit area. In one or more of the foregoing and/or following embodiments, the pair of second buried power supply wirings are aligned with the pair of fourth buried power supply wirings in the first direction, respectively. In one or more of the foregoing and/or following embodiments, the semiconductor device further includes a backside power delivery circuit disposed over a back surface of the substrate and including a first back side power supply wiring coupled to a first potential and a second back side power supply coupled to a second potential different from the first potential. The second buried power supply wiring is connected to the first back side power supply wiring by a first through-silicon via (TSV) passing through the substrate, and the third buried power supply wiring is connected to the second back side power supply wiring by a second TSV. In one or more of the foregoing and/or following embodiments, in the power switch area, two or more fin structures are arranged along a second direction crossing the first direction between the first buried power supply wiring and one of the pair of second buried power supply wirings, in the logic circuit area, two or more fin structures are arranged along the second direction between the third buried power supply wiring and one of the pair of fourth buried power supply wirings, the two or more fin structures in the power switch area are for FETs having a same conductivity type, and the two or more fin structures in the power switch area are for FETs having different conductivity type. In one or more of the foregoing and/or following embodiments, the two or more fin structures in the power switch area are aligned in the first direction with the two or more fin structures in the power switch area, respectively. In one or more of the foregoing and/or following embodiments, a number of the two or more fin structures in the power switch area is different from a number of the two or more fin structures in the power switch area. In one or more of the foregoing and/or following embodiments, one of the two or more fin structures in the logic circuit area, which has a same conductivity type as the two or more fin structures in the power switch area is coupled to the third buried power supply wiring. In one or more of the foregoing and/or following embodiments, one of the two or more fin structures in the logic circuit area, which has a different conductivity type as the two or more fin structures in the power switch area is coupled to the one of the pair of fourth buried power supply wirings. In one or more of the foregoing and/or following embodiments, a distance between one the pair of second buried power supply wirings and the first buried power supply wiring is smaller than a distance between one the pair of fourth buried power supply wirings and the third buried power supply wiring.

In accordance with another aspect of the present disclosure, a semiconductor device includes a power switch area and a logic circuit area. The semiconductor device includes a substrate, and a front side circuit disposed over a front surface of the substrate. The front side circuit includes a plurality of semiconductor fins and a first front side insulating layer covering bottom portions of the plurality of semiconductor fins, and a plurality of buried power supply wirings embedded in the first front side insulating layer and extending in a first direction. The plurality of buried power supply wirings includes a first buried power supply wiring and a second buried power supply wiring. The power switch area of the front side circuit includes the first and second buried power supply wirings, and a power switch configured to electrically connect and disconnect the first buried power supply wiring and the pair of second buried power supply wirings. The second buried power supply wiring extends into the logic circuit area, the first buried power supply wiring does not extend into the logic circuit area, and the power switch is configured to turn on and off power supply to the logic circuit through the first buried power supply wirings. In one or more of the foregoing and/or following embodiments, the semiconductor device further includes a backside power delivery circuit disposed over a back surface of the substrate and including a first back side power supply wiring coupled to a first potential and a second back side power supply coupled to a second potential different from the first potential. The logic circuit area includes a third buried power supply wiring, the second buried power supply wiring is connected to the first back side power supply wiring by a first through-silicon via (TSV) passing through the substrate, and the third buried power supply wiring is connected to the second back side power supply wiring by a second TSV.

In accordance with another aspect of the present disclosure, in a method of manufacturing a semiconductor device, a front side circuit is formed at a front side of a first substrate. The front side circuit includes buried power supply wirings. A second substrate with an insulating layer is attached to a back side of the first substrate. A through-silicon-via (TSV) passing through the first substrate is formed to be connected to the buried power supply wiring.

A back side power supply wiring is formed. A first interlayer dielectric (ILD) layer is formed over the back side power supply wiring. The front side circuit includes a power switching circuit that controls power supply from the backside power supply wiring to the buried power supply wiring. In one or more of the foregoing and/or following embodiments, electrodes to be connected to outside and additional wirings are formed. In one or more of the foregoing and/or following embodiments, the front side circuit includes FinFETs and a multi-layer wiring structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a front side circuit disposed over a front surface of the substrate; and
a backside power delivery circuit disposed over a back surface of the substrate and including a first back side power supply wiring, wherein:
the front side circuit includes:
    a plurality of power supply wirings including a first power supply wiring and a second power supply wiring; and
    a power switch configured to electrically connect and disconnect the first power supply wiring and the second power supply wiring, and
the second power supply wiring is connected to the first back side power supply wiring by a first through-silicon via (TSV) passing through the substrate.

2. The semiconductor device of claim 1, wherein:
the backside power delivery circuit includes a second back side power supply wiring,
the plurality of power supply wirings further includes a third power supply wiring, and
the third power supply wiring is connected to the second back side power supply wiring by a second TSV passing through the substrate.

3. The semiconductor device of claim 2, wherein:
the plurality of power supply wirings extend in a first direction, and
the second power supply wiring is separated from and aligned with the third power supply wiring in the first direction.

4. The semiconductor device of claim 3, further comprising a power switch area and a logic circuit area, wherein:
the power switch area includes the power switch, the second power supply wiring and the first TSV,
the logic circuit area includes the third power supply wiring and the second TSV, and
the first power supply wiring is continuously disposed in the power switch area and the logic circuit area.

5. The semiconductor device of claim 4, wherein no TSV is connected to the first power supply wiring.

6. The semiconductor device of claim 4, wherein:
the power switch area includes only one conductivity type fin field effect transistors (FinFETs), and
the logic circuit area includes a CMOS circuit comprising FinFETs.

7. The semiconductor device of claim 6, wherein:
the plurality of power supply wirings extend in the first direction, and
the second power supply wiring is separated from and is not aligned with the third power supply wiring in the first direction in plan view.

8. The semiconductor device of claim 7, wherein:
one of a plurality of semiconductor fins in the FinFETs in the power switch area is aligned with the third power supply wiring in the first direction in plan view.

9. The semiconductor device of claim 1, wherein:
the power switch includes a fin field effect transistor (FinFET), and
a source of the FinFET is connected to the second power supply wiring and a drain of the FinFET is connected to the first power supply wiring.

10. A semiconductor device, the semiconductor device comprising:
a substrate; and
a front side circuit disposed over a front surface of the substrate, a front side insulating layer being disposed over the front surface, wherein:
the front side circuit includes:
    a plurality of buried power supply wirings embedded in the first front side insulating layer and extending in a first direction, the plurality of buried power supply wirings including a first buried power supply wiring, a pair of second buried power supply wirings sandwiching the first buried power supply wiring, a third buried power supply wiring, and a pair of fourth buried power supply wirings sandwiching the third buried power supply wiring; and
    a power switch configured to electrically connect and disconnect the first buried power supply wiring and the pair of second buried power supply wirings,
the pair of second buried power supply wirings are separated from the pair of fourth buried power supply wirings, respectively, and
the first buried power supply wiring and the third buried power supply wirings form one continuously extending wiring.

11. The semiconductor device of claim 10, wherein the pair of second buried power supply wirings are aligned with the pair of fourth buried power supply wirings in the first direction, respectively.

12. The semiconductor device of claim 11, further comprising:
a backside power delivery circuit disposed over a back surface of the substrate and including a first back side power supply wiring and a second back side power supply wiring, wherein:
the second buried power supply wiring is connected to the first back side power supply wiring by a first through-silicon via (TSV) passing through the substrate, and
the third buried power supply wiring is connected to the second back side power supply wiring by a second TSV passing through the substrate.

13. The semiconductor device of claim 12, wherein:
two or more fin structures for FETs having a same conductivity type are arranged along a second direction crossing the first direction between the first buried power supply wiring and one of the pair of second buried power supply wirings, two or more fin structures for FETs having different conductivity types are arranged along the second direction between the third buried power supply wiring and one of the pair of fourth buried power supply wirings.

14. The semiconductor device of claim 13, wherein the two or more fin structures for the FETs having a same conductivity type are aligned in the first direction with the two or more fin structures for the FETs having different conductivity types, respectively.

15. The semiconductor device of claim 13, wherein one of the two or more fin structures for the FETs having a same conductivity type is not aligned in the first direction with none of the two or more fin structures for the FETs having different conductivity types.

16. The semiconductor device of claim 13, wherein one of the two or more fin structures for the FETs having different conductivity types is coupled to the third buried power supply wiring.

17. The semiconductor device of claim 16, wherein another one of the two or more fin structures for the FETs having different conductivity types is coupled to the one of the pair of fourth buried power supply wirings.

18. The semiconductor device of claim 10, wherein a distance between one of the pair of second buried power supply wirings and the first buried power supply wiring is smaller than a distance between one of the pair of fourth buried power supply wirings and the third buried power supply wiring.

19. A semiconductor device including comprising:
a substrate;
a front side circuit disposed over a front surface of the substrate; and
a backside power delivery circuit disposed over a back surface of the substrate and including a back side power supply wiring, wherein:
the front side circuit includes:
   a first fin structure comprising a source region and a drain region;
   a gate structure disposed over the first fin structure;
   a buried power supply wiring; and
   a conductive connection pattern connecting one of the source region or the drain region to the buried power supply line, and
the buried power supply wiring is connected to the back side power supply wiring by a through-silicon via (TSV) passing through the substrate.

20. The semiconductor device of claim 19, wherein:
the front side circuit further includes a second fin structure comprising a source region and a drain region,
the buried power supply wiring is disposed between the first fin structure and the second fin structure in plan view, and
the conductive connection pattern connects one of the source region or the drain region of the second fin structure to the buried power supply line.

* * * * *